(12) United States Patent
Chang et al.

(10) Patent No.: US 12,200,875 B2
(45) Date of Patent: Jan. 14, 2025

(54) COPPER METALLIZATION FOR THROUGH-GLASS VIAS ON THIN GLASS

(71) Applicant: Industrial Technology Research Institute, Hsinchu (TW)

(72) Inventors: Yiu-Hsiang Chang, Taoyuan (TW); Jen-Chieh Lin, Horseheads, NY (US); Prantik Mazumder, Ithaca, NY (US); Scott Christopher Pollard, Big Flats, NY (US); Pei-Lien Tseng, Zhubei (TW)

(73) Assignee: Industrial Technology Research Institute, Hsinchu (TW)

( * ) Notice: Subject to any disclaimer, the term of this patent is extended or adjusted under 35 U.S.C. 154(b) by 730 days.

(21) Appl. No.: 17/277,748

(22) PCT Filed: Sep. 20, 2019

(86) PCT No.: PCT/US2019/052126
§ 371 (c)(1),
(2) Date: Mar. 19, 2021

(87) PCT Pub. No.: WO2020/061437
PCT Pub. Date: Mar. 26, 2020

(65) Prior Publication Data
US 2021/0360797 A1 Nov. 18, 2021

Related U.S. Application Data

(60) Provisional application No. 62/733,991, filed on Sep. 20, 2018.

(51) Int. Cl.
*H05K 3/42* (2006.01)
*C23C 18/16* (2006.01)
(Continued)

(52) U.S. Cl.
CPC ......... *H05K 3/423* (2013.01); *C23C 18/1653* (2013.01); *C25D 7/00* (2013.01); *H05K 1/0306* (2013.01)

(58) Field of Classification Search
CPC ...... H05K 3/423; H05K 3/429; H05K 3/4038; H01L 23/49827; H01L 23/15; C23C 18/1653; C25D 7/00; Y10T 29/49165
See application file for complete search history.

(56) References Cited

U.S. PATENT DOCUMENTS 208,387 A 9/1878 George
237,571 A 2/1881 Messier
(Continued)

FOREIGN PATENT DOCUMENTS

CN 100494879 C 6/2009
CN 103080034 A 5/2013
(Continued)

OTHER PUBLICATIONS

Allvia; "Allvia Launches New Product Lines for Through Glass Vias (TGV) and Through Quartz Vias (TQV)" ; 2 Pages; https://www.allvia.com/ews/1606_allvia_launches_new_product_lines_for_through_glass_vias_and_through_quartz_vias.html; retrieved on Sep. 30, 2019.
(Continued)

Primary Examiner — Donghai D Nguyen
(74) Attorney, Agent, or Firm — Svetlana Z. Short

(57) ABSTRACT

A method for metallizing through-glass vias in a glass substrate includes functionalizing a surface of the glass substrate with a silane. The glass substrate has an average thickness t and comprises a plurality of vias extending through the thickness t. The method further includes applying an electroless plating solution comprising a copper ion to deposit a copper seed layer on the functionalized surface,
(Continued)

disposing an electrolyte within the plurality of vias, wherein the electrolyte comprises copper ions to be deposited on the copper seed layer within the plurality of vias; positioning an electrode within the electrolyte; and applying a current between the electrode and the glass substrate, thereby reducing the copper ions into copper within the plurality of vias such that each of the plurality of vias is filled with copper and the copper has a void volume fraction of less than 5%.

15 Claims, 12 Drawing Sheets

(51) Int. Cl.
*C25D 7/00* (2006.01)
*H05K 1/03* (2006.01)

(56) References Cited

U.S. PATENT DOCUMENTS

| | | |
|---|---|---|
| 3,798,013 A | 3/1974 | Hasegawa et al. |
| 4,214,886 A | 7/1980 | Shay et al. |
| 4,395,271 A | 7/1983 | Beall et al. |
| 4,732,780 A | 3/1988 | Mitoff et al. |
| 4,776,869 A | 10/1988 | Offenbacher et al. |
| 5,166,037 A | 11/1992 | Atkinson et al. |
| 5,340,947 A | 8/1994 | Credle et al. |
| 5,745,236 A | 4/1998 | Haga |
| 5,746,884 A | 5/1998 | Gupta et al. |
| 5,909,284 A | 6/1999 | Nakamura |
| 5,925,443 A | 7/1999 | Aoude et al. |
| 5,933,230 A | 8/1999 | Maino et al. |
| 5,969,422 A | 10/1999 | Ting et al. |
| 6,072,624 A | 6/2000 | Dixon et al. |
| 6,077,780 A | 6/2000 | Dubin |
| 6,234,755 B1 | 5/2001 | Bunker et al. |
| 6,344,242 B1 | 2/2002 | Stolk et al. |
| 6,406,777 B1 | 6/2002 | Boss et al. |
| 6,734,101 B1 | 5/2004 | Bao et al. |
| 6,906,795 B2 | 6/2005 | Goto et al. |
| 6,951,816 B2 | 10/2005 | Nopper et al. |
| 7,019,257 B2 | 3/2006 | Stevens |
| 7,043,072 B2 | 5/2006 | Goto et al. |
| 7,211,899 B2 | 5/2007 | Taniguchi et al. |
| 7,407,889 B2 | 8/2008 | Tsunetomo et al. |
| 7,514,149 B2 | 4/2009 | Bocko et al. |
| 7,528,967 B2 | 5/2009 | Okawauchi et al. |
| 7,626,665 B2 | 12/2009 | Koike |
| 7,683,370 B2 | 3/2010 | Kugimiya et al. |
| 7,749,809 B2 | 7/2010 | How et al. |
| 7,894,870 B1 | 2/2011 | Lucisano et al. |
| 7,994,503 B2 | 8/2011 | Hino et al. |
| 8,119,462 B2 | 2/2012 | Takasawa et al. |
| 8,163,649 B2 | 4/2012 | Koike et al. |
| 8,187,716 B2 | 5/2012 | Sutter et al. |
| 8,338,957 B2 | 12/2012 | Nilsson |
| 8,354,337 B2 | 1/2013 | Matsumoto et al. |
| 8,384,083 B2 | 2/2013 | Mori et al. |
| 8,411,459 B2 | 4/2013 | Yu et al. |
| 8,482,189 B2 | 7/2013 | Goto et al. |
| 8,531,679 B2 | 9/2013 | Scheiner |
| 8,535,997 B2 | 9/2013 | Kawakami et al. |
| 8,569,165 B2 | 10/2013 | Gordon et al. |
| 8,643,129 B2 | 2/2014 | Laming et al. |
| 8,673,779 B1 | 3/2014 | Yoon et al. |
| 8,699,037 B2 | 4/2014 | Cox |
| 8,742,588 B2 | 6/2014 | Nilsson et al. |
| 8,836,126 B2 | 9/2014 | Ochimizu et al. |
| 8,871,641 B2 | 10/2014 | Nilsson |
| 8,873,067 B2 | 10/2014 | Lee et al. |
| 9,024,443 B2 | 5/2015 | Inaba et al. |
| 9,093,381 B2 | 7/2015 | Barriere et al. |
| 9,140,539 B2 | 9/2015 | Scheiner |
| 9,232,652 B2 | 1/2016 | Fushie et al. |
| 9,236,274 B1* | 1/2016 | Mobley ................ H05K 3/4038 |
| 9,278,855 B2 | 3/2016 | Boek et al. |
| 9,296,646 B2 | 3/2016 | Burket et al. |
| 9,305,470 B2 | 4/2016 | Miki et al. |
| 9,337,060 B1 | 5/2016 | Mobley et al. |
| 9,346,706 B2 | 5/2016 | Bazemore et al. |
| 9,374,892 B1 | 6/2016 | Mobley et al. |
| 9,377,583 B2 | 6/2016 | Giaretta et al. |
| 9,517,963 B2 | 12/2016 | Marjanovic et al. |
| 9,656,909 B2 | 5/2017 | Burket et al. |
| 9,676,046 B2 | 6/2017 | Hamada et al. |
| 9,745,220 B2 | 8/2017 | Burket et al. |
| 9,760,986 B2 | 9/2017 | Ramamurthy et al. |
| 9,832,868 B1 | 11/2017 | Wright et al. |
| 9,850,160 B2 | 12/2017 | Marjanovic et al. |
| 10,144,093 B2 | 12/2018 | Marjanovic et al. |
| 10,203,476 B2 | 2/2019 | Cui |
| 10,410,883 B2 | 9/2019 | Bellman et al. |
| 10,440,835 B1 | 10/2019 | Grober |
| 10,454,571 B2 | 10/2019 | Gutman et al. |
| 10,508,357 B2* | 12/2019 | Jayaraju ................ H05K 3/423 |
| 2002/0004301 A1 | 1/2002 | Chen et al. |
| 2002/0051563 A1 | 5/2002 | Goto et al. |
| 2002/0180015 A1 | 12/2002 | Yamaguchi et al. |
| 2003/0082356 A1 | 5/2003 | Suemasu et al. |
| 2003/0137056 A1 | 7/2003 | Taniguchi et al. |
| 2003/0206651 A1 | 11/2003 | Goto et al. |
| 2003/0221967 A1 | 12/2003 | Tsuchida et al. |
| 2004/0058476 A1 | 3/2004 | Enquist et al. |
| 2004/0094524 A1 | 5/2004 | Stevens |
| 2004/0166340 A1 | 8/2004 | Cairns et al. |
| 2004/0203181 A1 | 10/2004 | Shang et al. |
| 2004/0235294 A1 | 11/2004 | Imori et al. |
| 2004/0256619 A1 | 12/2004 | Nomura et al. |
| 2005/0029238 A1 | 2/2005 | Chen |
| 2005/0033184 A1 | 2/2005 | Christoph |
| 2005/0064707 A1 | 3/2005 | Sinha |
| 2005/0067295 A1 | 3/2005 | Dory et al. |
| 2005/0079650 A1 | 4/2005 | Mancini et al. |
| 2005/0266320 A1 | 12/2005 | Amemiya |
| 2006/0012766 A1 | 1/2006 | Klosner et al. |
| 2006/0093732 A1 | 5/2006 | Schut et al. |
| 2006/0192978 A1 | 8/2006 | Laguarta et al. |
| 2006/0233963 A1 | 10/2006 | Imori et al. |
| 2006/0283629 A1 | 12/2006 | Kikuchi et al. |
| 2007/0187142 A1 | 8/2007 | Suemasu et al. |
| 2008/0054467 A1 | 3/2008 | Ohba et al. |
| 2008/0067073 A1 | 3/2008 | Kagawa et al. |
| 2008/0087549 A1 | 4/2008 | Ishizuka et al. |
| 2008/0150138 A1 | 6/2008 | Bright et al. |
| 2008/0296768 A1 | 12/2008 | Chebiam et al. |
| 2009/0029189 A1 | 1/2009 | Moriwaki et al. |
| 2009/0032510 A1 | 2/2009 | Ando et al. |
| 2009/0117336 A1 | 5/2009 | Usui et al. |
| 2009/0263965 A1 | 10/2009 | Gordon et al. |
| 2009/0283910 A1 | 11/2009 | Hinomura |
| 2010/0096712 A1 | 4/2010 | Knechtel |
| 2010/0133697 A1 | 6/2010 | Nilsson |
| 2010/0284027 A1 | 11/2010 | Scheiner |
| 2010/0320604 A1 | 12/2010 | Isobayashi |
| 2011/0032467 A1 | 2/2011 | Koike |
| 2011/0049718 A1 | 3/2011 | Matsumoto et al. |
| 2011/0132883 A1 | 6/2011 | Sheng et al. |
| 2011/0147055 A1 | 6/2011 | Ma et al. |
| 2011/0294649 A1 | 12/2011 | Gomez et al. |
| 2011/0308942 A1 | 12/2011 | Liu et al. |
| 2012/0013022 A1 | 1/2012 | Sabuncuoglu et al. |
| 2012/0048604 A1 | 3/2012 | Cornejo et al. |
| 2012/0092681 A1 | 4/2012 | Cox |
| 2012/0121870 A1 | 5/2012 | Toury et al. |
| 2012/0125892 A1 | 5/2012 | Shimoi et al. |
| 2012/0125893 A1 | 5/2012 | Shimoi et al. |
| 2012/0133047 A1 | 5/2012 | Besling et al. |
| 2012/0139127 A1 | 6/2012 | Beyne |
| 2012/0152843 A1 | 6/2012 | McEvoy et al. |
| 2012/0168412 A1 | 7/2012 | Hooper |
| 2012/0196071 A1 | 8/2012 | Cornejo et al. |
| 2012/0217165 A1 | 8/2012 | Feng et al. |
| 2012/0235969 A1 | 9/2012 | Burns et al. |

(56) References Cited

U.S. PATENT DOCUMENTS

| | | |
|---|---|---|
| 2012/0241919 A1 | 9/2012 | Mitani |
| 2012/0276743 A1 | 11/2012 | Won et al. |
| 2013/0026645 A1 | 1/2013 | Mohammed et al. |
| 2013/0050226 A1 | 2/2013 | Shenoy et al. |
| 2013/0062210 A1 | 3/2013 | Fushie et al. |
| 2013/0075146 A1 | 3/2013 | Fushie et al. |
| 2013/0089701 A1 | 4/2013 | Hooper et al. |
| 2013/0105213 A1 | 5/2013 | Hu et al. |
| 2013/0119555 A1 | 5/2013 | Sundaram et al. |
| 2013/0163801 A1 | 6/2013 | Ha et al. |
| 2013/0199935 A1 | 8/2013 | Richardson et al. |
| 2013/0205835 A1 | 8/2013 | Giaretta et al. |
| 2013/0224492 A1 | 8/2013 | Bookbinder et al. |
| 2013/0228918 A1 | 9/2013 | Chen et al. |
| 2013/0247615 A1 | 9/2013 | Boek et al. |
| 2013/0249109 A1 | 9/2013 | Ma et al. |
| 2013/0286610 A1 | 10/2013 | Nakagawa |
| 2013/0330515 A1 | 12/2013 | Oh et al. |
| 2013/0337599 A1 | 12/2013 | Yun |
| 2013/0340480 A1 | 12/2013 | Nattermann et al. |
| 2014/0013804 A1 | 1/2014 | Ono et al. |
| 2014/0034374 A1 | 2/2014 | Cornejo et al. |
| 2014/0084466 A1 | 3/2014 | Matsumoto et al. |
| 2014/0106146 A1 | 4/2014 | Decker et al. |
| 2014/0127899 A1 | 5/2014 | Cabral et al. |
| 2014/0144681 A1 | 5/2014 | Pushparaj et al. |
| 2014/0147623 A1 | 5/2014 | Shorey et al. |
| 2014/0147624 A1 | 5/2014 | Streltsov et al. |
| 2014/0154439 A1 | 6/2014 | Demartino et al. |
| 2014/0166199 A1 | 6/2014 | Bellman et al. |
| 2014/0170378 A1 | 6/2014 | Bellman et al. |
| 2014/0186617 A1 | 7/2014 | Zhang et al. |
| 2014/0199519 A1 | 7/2014 | Schillinger et al. |
| 2014/0254004 A1 | 9/2014 | Wooder et al. |
| 2014/0262801 A1 | 9/2014 | Jayaraju et al. |
| 2014/0300728 A1 | 10/2014 | Drescher et al. |
| 2014/0363971 A1 | 12/2014 | Matsumoto |
| 2014/0376006 A1 | 12/2014 | Scheiner |
| 2015/0021775 A1 | 1/2015 | Matsumoto et al. |
| 2015/0036065 A1 | 2/2015 | Yousefpor et al. |
| 2015/0050422 A1 | 2/2015 | Tews et al. |
| 2015/0060402 A1 | 3/2015 | Burkett et al. |
| 2015/0076677 A1 | 3/2015 | Ebefors et al. |
| 2015/0083469 A1 | 3/2015 | Sunohara et al. |
| 2015/0099124 A1 | 4/2015 | Beunet et al. |
| 2015/0102498 A1 | 4/2015 | Enicks et al. |
| 2015/0166393 A1 | 6/2015 | Marjanovic et al. |
| 2015/0166395 A1 | 6/2015 | Marjanovic et al. |
| 2015/0166396 A1 | 6/2015 | Marjanovic et al. |
| 2015/0239775 A1 | 8/2015 | Amin et al. |
| 2015/0274583 A1 | 10/2015 | An et al. |
| 2015/0306847 A1 | 10/2015 | Bellman et al. |
| 2015/0329415 A1 | 11/2015 | Bellman et al. |
| 2015/0353348 A1 | 12/2015 | Vandemeer et al. |
| 2015/0368819 A1 | 12/2015 | Zhang et al. |
| 2016/0026842 A1 | 1/2016 | Withers et al. |
| 2016/0107925 A1 | 4/2016 | Burket et al. |
| 2016/0111380 A1 | 4/2016 | Sundaram et al. |
| 2016/0166395 A9 | 6/2016 | Weiman |
| 2016/0176751 A1 | 6/2016 | Lautenschlaeger et al. |
| 2016/0199944 A1 | 7/2016 | Hosseini |
| 2016/0201474 A1 | 7/2016 | Slavens et al. |
| 2016/0204126 A1 | 7/2016 | Amano |
| 2016/0208387 A1 | 7/2016 | Liu et al. |
| 2016/0219704 A1 | 7/2016 | Vandemeer et al. |
| 2016/0237571 A1 | 8/2016 | Liu et al. |
| 2016/0282584 A1 | 9/2016 | Cui |
| 2016/0305764 A1 | 10/2016 | Cui et al. |
| 2016/0312365 A1 | 10/2016 | Cordonier et al. |
| 2016/0317821 A1 | 11/2016 | Morioka et al. |
| 2016/0327744 A1 | 11/2016 | Giaretta et al. |
| 2016/0334203 A1 | 11/2016 | Cui et al. |
| 2016/0351410 A1 | 12/2016 | Fu et al. |
| 2016/0368100 A1 | 12/2016 | Marjanovic et al. |
| 2016/0376186 A1 | 12/2016 | Gross |
| 2017/0008122 A1 | 1/2017 | Wieland et al. |
| 2017/0036419 A1 | 2/2017 | Adib et al. |
| 2017/0160077 A1 | 6/2017 | Featherstone et al. |
| 2017/0207160 A1 | 7/2017 | Gowda et al. |
| 2017/0228884 A1 | 8/2017 | Yoshida |
| 2017/0229318 A1 | 8/2017 | Tsunetomo et al. |
| 2017/0252859 A1 | 9/2017 | Kumkar et al. |
| 2017/0276951 A1 | 9/2017 | Kumkar et al. |
| 2017/0287728 A1 | 10/2017 | Dahlberg et al. |
| 2017/0301585 A1 | 10/2017 | Koelling et al. |
| 2017/0363417 A1 | 12/2017 | Cui et al. |
| 2018/0057390 A1 | 3/2018 | Hackert et al. |
| 2018/0062342 A1 | 3/2018 | Comstock et al. |
| 2018/0068868 A1 | 3/2018 | Jaramillo et al. |
| 2018/0093914 A1 | 4/2018 | Akarapu et al. |
| 2018/0215647 A1 | 8/2018 | Ortner et al. |
| 2018/0249581 A1 | 8/2018 | Mamezaki et al. |
| 2018/0340262 A1 | 11/2018 | Hiranuma |
| 2018/0342450 A1 | 11/2018 | Huang et al. |
| 2018/0342451 A1 | 11/2018 | Dahlberg et al. |
| 2019/0239353 A1 | 8/2019 | Jayaraman |
| 2019/0269013 A1 | 8/2019 | Takagi et al. |
| 2019/0273038 A1 | 9/2019 | Nagano et al. |
| 2019/0304877 A1 | 10/2019 | Mobley et al. |
| 2019/0327840 A1 | 10/2019 | Bookbinder et al. |
| 2020/0095684 A1 | 3/2020 | Bookbinder et al. |
| 2020/0227277 A1 | 7/2020 | Brown et al. |
| 2021/0043464 A1 | 2/2021 | Nolet et al. |

FOREIGN PATENT DOCUMENTS

| | | |
|---|---|---|
| CN | 103219278 A | 7/2013 |
| CN | 104112696 A | 10/2014 |
| CN | 104364927 A | 2/2015 |
| CN | 104768320 A | 7/2015 |
| CN | 104897062 A | 9/2015 |
| CN | 105026385 A | 11/2015 |
| CN | 105448809 A | 3/2016 |
| CN | 109075080 A | 12/2018 |
| EP | 0247993 A1 | 12/1987 |
| EP | 0280918 A2 | 9/1988 |
| EP | 2095698 B1 | 9/2011 |
| EP | 3166372 A1 | 5/2017 |
| JP | 03-196664 A | 8/1991 |
| JP | 06-090074 A | 3/1994 |
| JP | 2001-044197 A | 2/2001 |
| JP | 2002-134659 A | 5/2002 |
| JP | 2003-148931 A | 5/2003 |
| JP | 2004-311919 A | 11/2004 |
| JP | 2004-363212 A | 12/2004 |
| JP | 2005-257339 A | 9/2005 |
| JP | 2006-287019 A | 10/2006 |
| JP | 2007-059796 A | 3/2007 |
| JP | 2008-288577 A | 11/2008 |
| JP | 2010-074017 A | 4/2010 |
| JP | 2011-171334 A | 9/2011 |
| JP | 2011-178642 A | 9/2011 |
| JP | 2013-095958 A | 5/2013 |
| JP | 2013-106015 A | 5/2013 |
| JP | 2013-220958 A | 10/2013 |
| JP | 2014-093406 A | 5/2014 |
| JP | 2014-524278 A | 9/2014 |
| JP | 2015-060981 A | 3/2015 |
| JP | 2015-082598 A | 4/2015 |
| JP | 2015-095590 A | 5/2015 |
| JP | 2015-146410 A | 8/2015 |
| JP | 2016-213253 A | 12/2016 |
| JP | 2017-022220 A | 1/2017 |
| JP | 2017-063109 A | 3/2017 |
| JP | 2017-098466 A | 6/2017 |
| JP | 2017-204527 A | 11/2017 |
| JP | 2018-113392 A | 7/2018 |
| JP | 2018-163986 A | 10/2018 |
| KR | 10-0803004 B1 | 2/2008 |
| KR | 10-2019-0003050 A | 1/2019 |
| TW | 201238387 A | 9/2012 |
| WO | 94/00966 A1 | 1/1994 |
| WO | 03/21004 A1 | 3/2003 |
| WO | 2004/024191 A2 | 3/2004 |

(56) References Cited

FOREIGN PATENT DOCUMENTS

| WO | 2005/063645 A1 | 7/2005 |
|---|---|---|
| WO | 2006/129354 A1 | 12/2006 |
| WO | 2008/110061 A1 | 9/2008 |
| WO | 2011/050073 A1 | 4/2011 |
| WO | 2012/027220 A2 | 3/2012 |
| WO | 2015/113023 A1 | 7/2015 |
| WO | 2015/157202 A1 | 10/2015 |
| WO | 2015/162775 A1 | 10/2015 |
| WO | 2016/010954 A2 | 1/2016 |
| WO | 2016/089844 A1 | 6/2016 |
| WO | 2016/114133 A1 | 7/2016 |
| WO | 2016/118683 A1 | 7/2016 |
| WO | 2016/176171 A1 | 11/2016 |
| WO | 2017/038075 A1 | 3/2017 |
| WO | 2017/062798 A1 | 4/2017 |
| WO | 2017/210376 A1 | 12/2017 |
| WO | 2018/101468 A1 | 6/2018 |
| WO | 2018/162385 A1 | 9/2018 |
| WO | 2019/055745 A1 | 3/2019 |

OTHER PUBLICATIONS

Anthony et al; "Microfabrication in Foturan Photosensitive Glass Using Focused Ion Beam"; Proceedings of the World Congress on Enbineering; vol. II; 2007; 6 Pages.

Bain et al; "Formation of Monolayers by the Coadsorption of Thiols on Gold: Variation in the Head Group, Tail Group, and Solvent"; Journal of the American Chemical Society, 1989, 111, 7155-7164.

Benjamin et al; "The Adhesion of Evaporated Metal Films on Glass"; Proc. Roy. Soc. A., vol. 261, (1962); pp. 516-531.

Borghi et al; "M2 Factor of Bessel-Gauss Beams"; Optics Letters; vol. 22, No. 5; (1997) pp. 262-264.

Chao; "Reliability Study of Hermetic Wafer Level MEMS Packaging With Through-Wafer Interconnect"; Microsystem Technologies; 2009, vol. 15, pp. 677-686.

Chen et al. "Development of an AOI system for chips with a hole on backside based on a frame imager" Proc. of SPIE vol. 9903, 2016. 6 pgs.

Choa, Microsystem Technologies, Reliability study of hermetic wafer level MEMS packaging with through-wafer interconnect, Feb. 2009, vol. 15, pp. 677-686 (Year: 2009).

Cui et al; "The Evolution of Pd/Sn Catalytic Surfaces in Electroless Copper Deposition"; Journal of the Electrochemical Society, 158 (3), pp. D172-D177.

Demir et al, "Reliability of Copper Through-Package Vias in Bare Glass interposers," IEEE Trans. Components, Packaging and Manufacturing Tech. 7(6) Jun. 2017, pp. 829-837.

Demir et al; "First Demonstration of Reliable Copper-Plated 30m Diameter Through-Package-Vias in Ultra-Thin Bare Glass Interposers" 2014 IEEE 64th Electronic Components and Technology Conference (ECTC).

Dixit, "Structural and Electronic Properties of a Mn Oxide Diffusion Barrier Layer Formed by Chemical Vapor Deposition," IEEE Transactions on Device and Materials Reliability, 11(2) Jun. 2011, pp. 295-302.

Dow et al; "Through-Hole Filling by Copper Electroplating"; Journal of the Electrochemical Society, 2008, vol. 155, No. 12, pp. D750-D757.

Gordon et al. "Chemical Vapor Deposition {CVD) of Manganese Self-Aligned Diffusion Barriers for Cu Interconnections in Microelectronics," Advanced Metallization Conference, 2008, 9 pgs.

Hunegnaw et al; "Vitrocoat GI—Ultra-Thin Adhesive Layer for Metallization of Glass Interposer", 10th International Microsystems, Packaging, Assembly, and Circuits Technology Conference (IMPACT) 2015, 4 Pages.

Iljima et al; "Resistivity Reduction By External Oxidation of Cu—Mn Alloy Films for Semiconductor Interconnect Application"; Journal of Vacuum Science & Technology B: Microelectronics and Nanometer Structures Processing, Measurement, and Phenomena, 27, 1963-1968 (2009.

Intergrace, "Borosilicate glass: technical glass by Pulles & Hanique: Duan & Pyrex," Pulles & Hanique B.V., 2 pgs. Published Mar. 15, 2012, retrieved from: https://web.archive.org/web/20120315092729/http://www.pulleshanique.com/02_borosilicate-glass.htm.

International Search Report and Written Opinion of the International Searching Authority; PCT/US2019/052126; Mailed Dec. 2, 2019; 10 Pages; European Patent Office.

Kanemoto et al; "Electroless Copper Plating Process by Applying Alternating One-Side Air Stirring Method for High-Aspect-Ratio Through-Holes"; J. Electrochem. Soc. 2017 vol. 164, Issue 12, D771-D777.

Kiyama et al; "Examination of Etching Agent and Etching Mechanism on Femtosecond Laser Microfabrication of Channels Inside Vitreous Silica Substrates"; J. Phys. Chem. C, 2009, 113, pp. 11560-11566.

Koike et al; "P-33: Cu—Mn Electrodes for a-Si TFT and Its Electrical Characteristics" ; SID Symposium Digest of Technical Papers, 41:1, 1343-1346 (2010).

Koike et al; "Self-Forming Diffusion Barrier Layer in Cu—Mn Alloy Metallization"; Appl Phys. Lett. 87, 041911-1-041911-3 (2005).

Liu et al; "Electroless and Electrolytic Copper Plating of Glass Interposer Combined With Metal Oxide Adhesion Layer for Manufacturing 30 RF Devices"; IEEE 66th Electronic Components and Technology Conference; pp. 62-67 (2016).

Lu et al; "Thermo-Mechanical Reliability of 3-D Ics Contianing Through Silicon Vias" ; IEEE Electronic Components and Technology Conference; pp. 630-634 (2009).

Lueck et al., Through glass vias (TGV) and aspects of reliability, 2015, 2015 IEEE 65th Electronic Components and Technology Conference (ECTC), pp. 672-677 (Year: 2015).

Metwalli et al; "Surface Characterization of Mono-, Di-, and Tri-Aminosiline Treated Glass Surface" ; Journal of Colloid and Interface Science, 298 (2006) pp. 825-831.

Microchemicals, "Silicon Wafers, Quartz Wafers, Glass Wafers," Product Specifications: Brochure. 2014, 28 pgs.

Neishi et al. "Formation of a manganese oxide barrier layer with thermal chemical vapor deposition for advanced large-scale integrated interconnect structure," Appl. Phys. Lett. 93, 032106 (2008) 3 pgs.

Ogutu et al; "Hybrid Method for Metallization of Glass Interposer"; Journal of the Electrochemical Society; 2013 ;vol. 160; No. 12; pp. 03228-03236.

Ogutu et. al., "Superconformal Filling of High Aspect Ratio through Glass Vias (TGV) for Interposer Applications Using TNBT and NTBC Additives", J Echem Soc 162 (9) 2015, D457-D464, doi:10.1149/2.0641509jes.

Pallavicini et al; "Self-Assembled Monolayers of Silver Nanoparticles Firmly Grafted on 3lass Surfaces: Low Ag+ Release for an Efficient Antibacterial Activity" ; Journal of Colloid and Interface Science; 350 (2010) 110-116.

Phuong et al. "Structural Characterization of a Manganese Oxide Barrier Layer Formed by Chemical Vapor Deposition for Advanced Interconnects Application on SiOC Dielectric Substrates," J_ Phys. Chem. C, 2013, 117 (1), pp. 160-164.

Ryu et al; "Impact of Near-Surface Thermal Stresses on Interfacial Reliability of Throughsilicon Vias for 3-D Interconnects"; IEEE Transactions on Device and Materials Reliability; 2011 vol. 11, No. 1; pp. 35-43.

Schott, Schott HermeS (Registered)—Hermetic Through Glass Vias (TGV), Jul. 2016 (Year: 2016).

Shachman-Diamond et al; "30 Years of Electroless Plating for Semiconductor and Polymer Mirco-Systems"; Microelectronic Engineering; 132 (2015) pp. 35-45.

Shen et al; "Periodic Pulse Reverse Cu Plating for Through-Hole Filling" ECS Electrochem. Lett. 2013 vol. 2, Issue 5, 2013, pp. D23-D25.

Shorey et al., Advancements in fabrication of glass interposers, 2014 IEEE 64th Electronic Components and Technology Conference (ECTC), IEEE, 2014, pp. 20-25.

Shorey et al; "Progress and Application of Through Glass Via (TGV) Technolgy", Corning Incorporated; 2016 ;6 Pages.

(56) References Cited

OTHER PUBLICATIONS

Shorey; "Leveraging Glass for Advanced Packaging and IoT"; Apr. 21, 2016, Retrieved Form the Internet: URL:http://www.corning.com/media/worldwide/cdt/documents/iMAPs%20-%20Corning%200verview%20-%204-21-16%20FINALpptx.pdf.
Siegman; "New Development in Laser Resonators"; SPIE, vol. 1227, Optical Resonators (1990) pp. 2-14.
Sukumaran; "Through-Package-Via Hole Formation, Metallization and Characterization for Ultra-Thin 30 Glass" 2014; Georgia Institute of Technology, a Dissertation; 201 Pages.
Takahashi et al., Development of High Frequency Device Using Glass or Fused Silica with 30 Integration, 2017 IEEE 67th Electronic Components and Technology Conference (ECTC), IEEE, 2017, pp. 758-763.
Thiele; "Relation Between Catalytic Activity and Size of Particle"; Industrial and Engineering Chemistry, vol. 31, No. 7; (1939) pp. 916-920.
Topper et al; "3-D Thin Film Interposer Based on TGV (Through Glass Vias): An Alternative to Si-Interposer"; IEEE, Electronic Components and Technology Conference; 2010; pp. 66-73.
U.S. Appl. No. 62/846,059; Cai et al. "Silicate Glass Compositions Useful for the Efficient Production of Through Glass Vias", filed May 10, 2019, 43 pgs.
U.S. Appl. No. 62/846,102; Guo et al. "High Silicate Glass Articles Possessing Through Glass Vias and Methods of Making and Using Thereof", filed May 10, 2019,36 pgs.
Wakayama et al. "Small size probe for inner profile measurement of pipes using optical fiber ring beam device" Proc. of SPIE vol. 8563, 2012. 7 pgs.
Wu et al, "A Study on Annealing Mechanisms With Different Manganese Contents in CuMn Alloy"; Journal of Alloys and Compounds, vol. 542, 2012, pp. 118-123.
Yun et al; "P-23:The Contact Properties and TFT Structures of A-IGZO TFTS Combined With Cu—Mn Alloy Electrodes"; SID Symposium Digest of Technical Papers 42:1, 1177-1180.
Zavyalov, "3D Hole Inspection Using Lens with High Field Curvature" Measurement Science Review, V. 15, No. 1, 2015. pp 52-57.
Bush, Glass seals MEMS for harsh environments, Nov. 2014, Electronics Weekly, <https://www.electronicsweekly.com/news/business/manufacturing/glass-seals-mems-harsh-environments-2014-11/> (Year: 2014).
Chang et al., Communication—Defect-Free Filling of High Aspect Ratio Through Vias in Ultrathin Glass, Nov. 2018, Journal of Electrochemical Society, vol. 166, No. 1 (Year: 2018).
Fu et al., Adhesive enabling technology for directly plating copper onto glass/ceramic substrates, May 2014, 2014 IEEE 64th Electronic Components and Technology Conference (ECTC) (Year: 2014).
Keusseyan et al., Material and Process Developments for Robust and High Reliability Glass Wafers for 2.5D Packaging, Jan. 2015, Additional Conferences (Device Packaging, HiTEC, HiTEN, and CICMT) 2015 (Year: 2015).
Krohnert et al., Through Glass Vias for hermetically sealed High Frequency Application, Jan. 2019, Additional Conferences (Device Packaging, HiTEC, HiTEN, and CICMT) 2019 (Year: 2019).
Kuramochi et al., Glass Substrate with TGV(Thru Glass Via) Manufacturing Technology for Display Electronics, Jun. 2017, Society for Information Display Digest of Technical Papers, vol. 48, Issue 1, pp. 1201-1204 (Year: 2017).
Lee et al., Through-glass copper via using the glass reflow and seedless electroplating processes for wafer-level RF MEMS packaging, Jun. 2013, Journal of Micromechanics and Microengineering, vol. 23, No. 8 (Year: 2013).
Li et al., Fabrication of high-density electrical feed-throughs by deep-reactive-ion etching of Pyrex glass, Dec. 2002, Journal of Microelectromechanical Systems, vol. 11, Issue 6, pp. 625-630 (Year: 2002).
Liu et al., Failure analysis of through-silicon vias in free-standing wafer under thermal-shock test, Jan. 2013, Microelectronics Reliability, vol. 53, Issue 1, pp. 70-78 (Year: 2013).
Mobley et al., High-reliability via interconnections in glass wafers for2.5D packaging, Oct. 2014, Chip Scale Review, vol. 18, No. 5, pp. 36-38 (Year: 2014).
Ogutu et al., Superconformal Filling of Through Vias in Glass Interposers, Jun. 2014, ECS Electrochemistry Letters, vol. 3, No. 8 ( Year: 2014).
Shah et al., Low-Loss, High-Linearity RF Interposers Enabled by Through Glass Vias, Nov. 2018, IEEE Microwave and Wireless Components Letters, vol. 28, Issue 11, pp. 960-962 (Year: 2018).
Shorey et al.,"Advancements in Fabrication of Glass Interposers",Electronic Components & Technology Conference,2014, pp. 6.
Sukumaran et al., Low-Cost Thin Glass Interposers as a Superior Alternative to Silicon and Organic Interposers for Packaging of 3-D ICs, Sep. 2012, IEEE Transactions on Components, Packaging and Manufacturing Technology, vol. 2, Issue 9, pp. 1426-1433 (Year: 2012).
Takahashi et al., "Development of High Frequency Device using Glass or Fused Silica with 3D Integration," Electronics Components and Technology Conference, 2017, pp. 758-763.
Takahashi et al., Development of Through Glass Via (TGV) formation technology using electrical discharging for2.5/3D integrated packaging, May 2013, 2013 IEEE 63rd Electronic Components and Technology Conference (Year: 2013).
Topper et al., 3-D Thin Film Interposer Based on TGV (Through Glass Vias): An Alternative to Si-Interposer, Jun. 2010, 2010 Proceedings 60th Electronic Components and Technology Conference (ECTC) (Year: 2010).
Woehrmann et al., Glass based interposers for RF applications up to 100GHz, Sep. 2016, 2016 6th Electronic System-Integration Technology Conference (ESTC) (Year: 2016).
Department of Defense, MIL-STD-750E, Nov. 2006 (Year: 2006).
ESPEC Corp., The Concept of Relative Humidity in HAST, Feb. 2013, <https://www.test-navi.com/eng/research/handbook/pdf/07_TheConceptOfRelativeHumidityInHAST.pdf> (Year: 2013).
Keusseyan et al., RDL Multilayer Metallization Approaches for TGV, Jan. 2017, Additional Conferences (Device Packaging, HiTEC, HiTEN, and CICMT) (Year: 2017).
Schott, "MEMS Tightly Sealed with Schott HermeS (Trademark)", Jan. 2010, Tech Buzz: Electronic Packaging, Issue 2, <https://www.schott.com/d/epackaging/8e070fc9-4009-40c2-bca7-323542ee3a15/1.4/schott_tech_buzzJan_2010.pdf> (Year: 2010).
TJ Green Associates, "Hermetic vs "Near Hermetic" Packagingi A Technical Review", Sep. 2016, <https://www.tjgreenllc.com/2016/09/21/hermetic-vs-near-hermetic-packaging-a-technical-review/> (Year: 2016).
University of Maryland, Temperature Humidity Bias, Jun. 2008, <https://calce.umd.edu/temperature-humidity-bias> (Year: 2008).
Japanese Patent Application No. 2021-516420, Office Action dated Aug. 29, 2023, 6 pages (English Translation only), Japanese Patent Office.

* cited by examiner

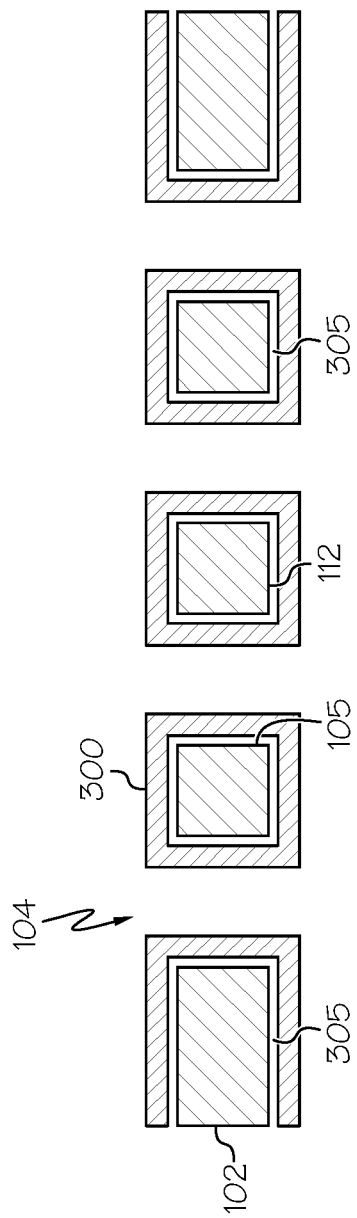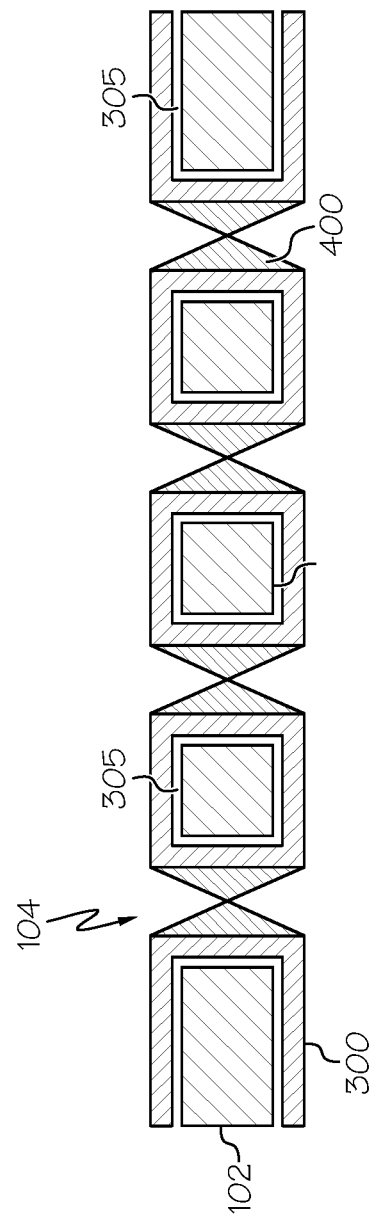

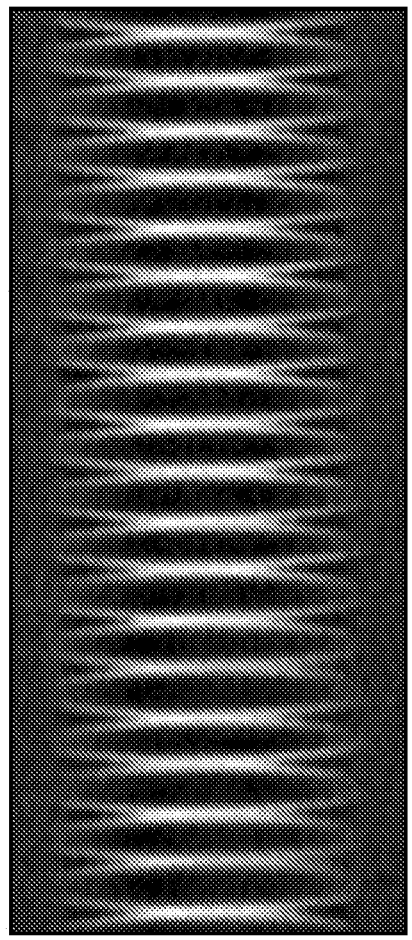
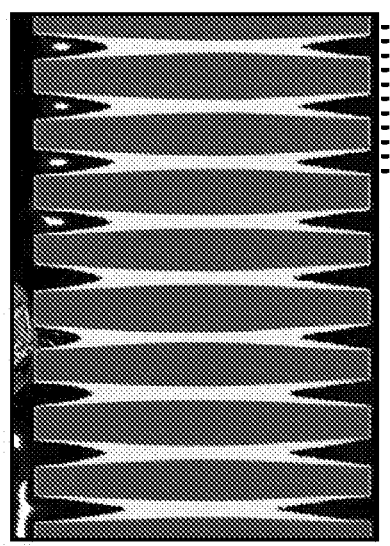
FIG. 7B CT SCAN IMAGE
FIG. 7A SEM CROSS SECTION

CT SCAN IMAGE

SEM CROSS SECTION

COPPER METALLIZATION FOR THROUGH-GLASS VIAS ON THIN GLASS

This application claims the benefit of priority under 35 U.S.C. § 371 of International Application No. PCT/US2019/052126, filed on Sep. 20, 2019, which claims the benefit of priority under 35 U.S.C. § 120 of U.S. Application Ser. No. 62/733,991 filed on Sep. 20, 2018, the content of which is relied upon and incorporated herein by reference in its entirety.

BACKGROUND

Field

The present specification generally relates to the manufacture of through-glass vias and, more specifically, to copper metallization of through-glass vias.

Technical Background

Through-substrate vias provide electrical connections between layers in a physical electronic circuit or chip. For example, in a three-dimensional stacked integrated circuit, the through-substrate vias enable integration of electronic components both vertically and horizontally. Conventionally, through-substrate vias are used in silicon substrates. However, because glass is less expensive than silicon, glass substrates are becoming more prevalent in electronic devices. Glass substrates may also provide improved electromagnetic loss properties, improved dielectric properties, tailorable coefficients of thermal expansion, and the ability to come in scalable form factors, including roll-to-roll forms.

Conventional processes for metallizing vias include dry processes and wet processes. Dry processes, such as physical vapor deposition (PVD) and chemical vapor deposition (CVD), are carried out in an environment under vacuum, which limits throughput and adds to manufacturing costs. Additionally, such dry processes may be limited in terms of their ability to produce a continuous metal layer within vias of glass substrates with aspect ratios greater than 5, wherein the aspect ratio is the ratio of the average thickness of the glass substrate to the average diameter of the vias, particularly where the via diameter is small (e.g., less than 50 µm). Wet processes, such as electroless plating, are cost effective compared to dry processes, but have been conventionally limited to use on vias with large diameters (e.g., greater than 75 µm).

Accordingly, a need exists for alternative methods for metallizing through-glass vias having small diameters and high aspect ratios.

SUMMARY

According to various aspects disclosed herein, a method for metallizing through-glass vias in a glass substrate includes functionalizing a surface of the glass substrate with a silane. The glass substrate has an average thickness t and comprises a plurality of vias extending through the thickness t. The method further includes applying an electroless plating solution comprising a copper ion to deposit a copper seed layer on the functionalized surface, disposing an electrolyte within the plurality of vias, wherein the electrolyte comprises copper ions to be deposited on the copper seed layer within the plurality of vias; positioning an electrode within the electrolyte; and applying a current between the electrode and the glass substrate, thereby reducing the copper ions into copper within the plurality of vias such that each of the plurality of vias is filled with copper and the copper has a void volume fraction of less than 5%.

Another aspect includes the method of the previous aspect, wherein the average thickness t of the glass substrate is greater than or equal to 50 µm and less than or equal to 150 µm.

Another aspect includes the method of any of the previous aspects, wherein the average thickness t of the glass substrate is greater than or equal to 90 µm and less than or equal to 110 µm.

Another aspect includes the method of any of the previous aspects, wherein each of the plurality of vias has an average diameter of greater than or equal to 8 µm and less than or equal to 20 µm; and an aspect ratio of the average thickness t of the glass substrate to the average diameter of the plurality of vias is greater than or equal to 5:1 and less than or equal to 12:1.

Another aspect includes the method of any of the previous aspects, wherein the electrolyte further comprises chloride ions and an additive.

Another aspect includes the method of the previous aspect, wherein the additive consists of nitrotetrazolium blue chloride.

Another aspect includes the method of any of the previous aspects, wherein the additive is present in the electrolyte in a concentration of greater than or equal to 20 ppm and less than or equal to 60 ppm.

Another aspect includes the method of any of the previous aspects, wherein the chloride ions are present in the electrolyte in a concentration of greater than or equal to 20 ppm and less than or equal to 140 ppm.

Another aspect includes the method of any of the previous aspects, wherein applying the current comprises applying the current at a current density of greater than or equal to 0.05 amp s/dm$^2$ and less than or equal to 2 amp s/dm$^2$.

Another aspect includes the method of any of the previous aspects, wherein applying the current comprises applying a first current at a first current density for a first period of time and applying a second current at a second current density for a second period of time, wherein the second current density is greater than the first current density.

Another aspect includes the method of any of the previous aspects, further comprising wetting the glass substrate including the copper seed layer prior to disposing the electrolyte within the plurality of vias.

Another aspect includes the method of any of the previous aspects, wherein the copper in each of the plurality of vias has a void volume fraction of less than 1%.

Another aspect includes the method of any of the previous aspects, wherein the copper in each of the plurality of vias is free of voids.

Another aspect includes the method of any of the previous aspects, further comprising cleaning the glass substrate prior to functionalizing the surface, wherein the glass substrate has a water contact angle of less than or equal to 5 degrees after the cleaning.

Another aspect includes the method of any of the previous aspects, wherein functionalizing the surface of the glass substrate comprises functionalizing sidewalls of the plurality of vias.

Another aspect includes the method of any of the previous aspects, further comprising annealing the glass substrate comprising the copper seed layer prior to disposing the electrolyte within the plurality of vias.

According to another aspect, a glass article includes a glass substrate having a first major surface and a second major surface opposite the first major surface and separated from the first major surface by an average thickness of greater than or equal to 50 μm and less than or equal to 150 μm and a plurality of vias extending through the glass substrate from the first major surface to the second major surface. Each of the plurality of vias has an average diameter of greater than or equal to 8 μm and less than or equal to 20 μm. Additionally, an aspect ratio of the average thickness of the glass substrate to the average diameter of the plurality of vias is greater than or equal to 5:1 and less than or equal to 12:1 and each of the plurality of vias is filled with copper such that the copper in each of the plurality of vias has a void volume fraction of less than 5%.

Another aspect includes the glass article of the previous aspect, wherein the void volume fraction of the copper in each of the plurality of vias is less than 1%.

Another aspect includes the glass article of any of the previous aspects, wherein the copper in each of the plurality of vias is free of voids.

Another aspect includes the glass article of any of the previous aspects, wherein the average thickness of the glass substrate is greater than or equal to 90 μm and less than or equal to 110 μm.

Another aspect includes the glass article of any of the previous aspects, wherein the copper is deposited by electroless on sidewalls of the plurality of vias followed by electroplating.

Additional features and advantages will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

FIG. 3 schematically depicts a cross-section of a glass substrate having a seed layer deposited thereon in accordance with one or more embodiments shown and described herein;

FIG. 4 schematically depicts a cross-section of a glass substrate in which the electroplated electrically conductive material forms "butterflies" within each of the plurality of vias in accordance with one or more embodiments shown and described herein;

FIG. 7A is an SEM image showing the formation of a plug formed from the copper within the 10 μm vias in accordance with one or more embodiments shown and described herein;

FIG. 7B is a CT scan image further evidencing the formation of the plug formed from the copper within the 10 μm vias in accordance with one or more embodiments shown and described herein;

DETAILED DESCRIPTION

Figure 1:
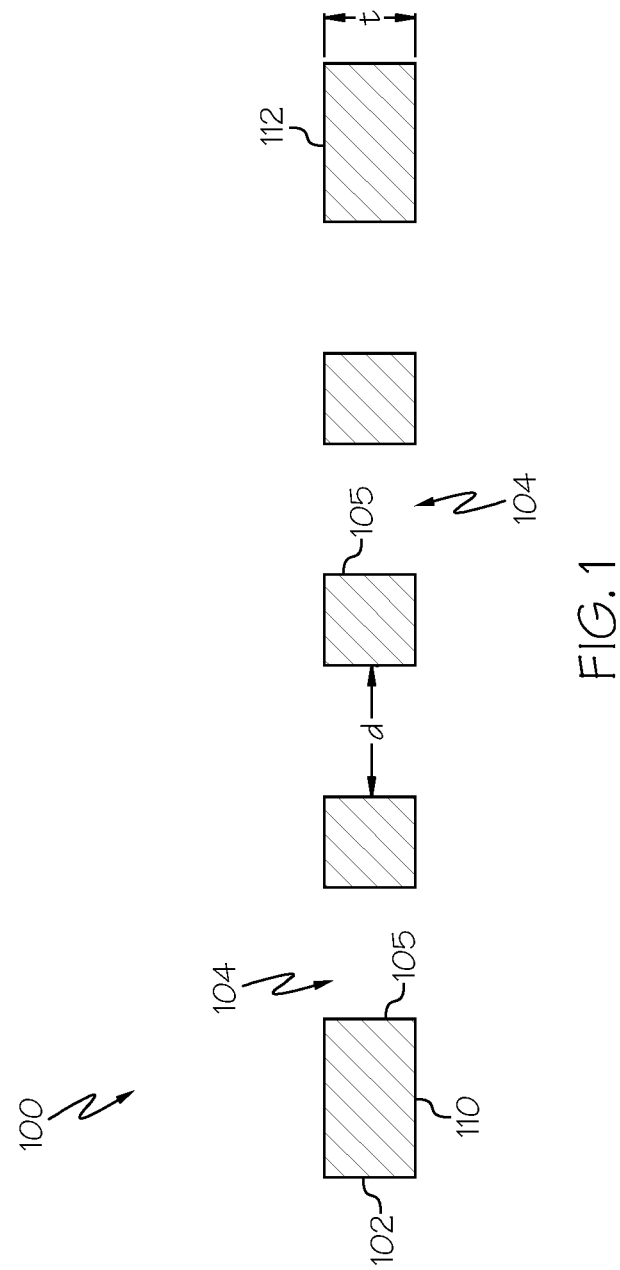
FIG. 1 schematically depicts a cross-section of a glass substrate including a plurality of vias in accordance with one or more embodiments shown and described herein.

Reference will now be made in detail to various embodiments, examples of which are illustrated in the accompanying drawings. Whenever possible, the same reference numerals will be used throughout the drawings to refer to the same or like parts. One embodiment of components used in the methods of the present disclosure is shown in FIG. 1, and is designated generally throughout by the reference numeral 100. The components generally include a glass substrate including a plurality of vias having an aspect ratio greater than or equal to 5:1, wherein the aspect ratio is equal to the average thickness t of the glass substrate to the average diameter of the vias, that are filled with an electrically conductive material such that the electrically conductive material has a void volume fraction of less than or equal to 5%.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise. Also, the word "or" when used without a preceding "either" (or other similar language indicating that "or" is unequivocally meant to be exclusive—e.g., only one of x or y, etc.) shall be interpreted to be inclusive (e.g., "x or y" means one or both x or y).

The term "and/or" shall also be interpreted to be inclusive (e.g., "x and/or y" means one or both x or y). In situations where "and/or" or "or" are used as a conjunction for a group of three or more items, the group should be interpreted to include one item alone, all the items together, or any combination or number of the items. Moreover, terms used in the specification and claims such as have, having, include, and including should be construed to be synonymous with the terms comprise and comprising.

Unless otherwise indicated, all numbers or expressions, such as those expressing dimensions, physical characteristics, and the like, used in the specification (other than the claims) are understood to be modified in all instances by the term "approximately." At the very least, and not as an attempt to limit the application of the doctrine of equivalents to the claims, each numerical parameter recited in the specification or claims which is modified by the term "approximately" should be construed in light of the number of recited significant digits and by applying ordinary rounding techniques.

All disclosed ranges are to be understood to encompass and provide support for claims that recite any and all subranges or any and all individual values subsumed by each range. For example, a stated range of 1 to 10 should be considered to include and provide support for claims that recite any and all subranges or individual values that are between and/or inclusive of the minimum value of 1 and the maximum value of 10; that is, all subranges beginning with a minimum value of 1 or more and ending with a maximum value of 10 or less (e.g., 5.5 to 10, 2.34 to 3.56, and so forth) or any values from 1 to 10 (e.g., 3, 5.8, 9.9994, and so forth).

All disclosed numerical values are to be understood as being variable from 0-100% in either direction and thus provide support for claims that recite such values or any and all ranges or subranges that can be formed by such values. For example, a stated numerical value of 8 should be understood to vary from 0 to 16 (100% in either direction) and provide support for claims that recite the range itself (e.g., 0 to 16), any subrange within the range (e.g., 2 to 12.5) or any individual value within that range (e.g., 15.2).

The drawings shall be interpreted as illustrating one or more embodiments that are drawn to scale and/or one or more embodiments that are not drawn to scale. This means the drawings can be interpreted, for example, as showing: (a) everything drawn to scale, (b) nothing drawn to scale, or (c) one or more features drawn to scale and one or more features not drawn to scale. Accordingly, the drawings can serve to provide support to recite the sizes, proportions, and/or other dimensions of any of the illustrated features either alone or relative to each other. Furthermore, all such sizes, proportions, and/or other dimensions are to be understood as being variable from 0-100% in either direction and thus provide support for claims that recite such values or any and all ranges or subranges that can be formed by such values.

The terms recited in the claims should be given their ordinary and customary meaning as determined by reference to relevant entries in widely used general dictionaries and/or relevant technical dictionaries, commonly understood meanings by those in the art, etc., with the understanding that the broadest meaning imparted by any one or combination of these sources should be given to the claim terms (e.g., two or more relevant dictionary entries should be combined to provide the broadest meaning of the combination of entries, etc.) subject only to the following exceptions: (a) if a term is used in a manner that is more expansive than its ordinary and customary meaning, the term should be given its ordinary and customary meaning plus the additional expansive meaning, or (b) if a term has been explicitly defined to have a different meaning by reciting the term followed by the phrase "as used in this document shall mean" or similar language (e.g., "this term means," "this term is defined as," "for the purposes of this disclosure this term shall mean," etc.). References to specific examples, use of "i.e.," use of the word "invention," etc., are not meant to invoke exception (b) or otherwise restrict the scope of the recited claim terms. Other than situations where exception (b) applies, nothing contained in this document should be considered a disclaimer or disavowal of claim scope.

In the three-dimensional integrated circuit (3D-IC) industry, stacking devices is a technique being used to increase device performance in a limited space. The performance of the integrated circuit may be further enhanced through the use of thinner substrates and smaller vias, which leads to higher aspect ratios (e.g., aspect ratios the average thickness of the glass substrate to the average diameter of the via of greater than or equal to 4:1), thereby reducing packaging size and stress effects. However, the higher the aspect ratio, the more difficult it is to metallize the sidewalls of the vias, particularly when the vias have small (e.g., less than or equal to 50 μm) diameters, which may lead to voids within the electrically conductive material within the vias after filling.

The methods of the present disclosure enable through-glass vias to be filled with an electrically conductive material, such as copper or another metal, despite the challenges associated with the glass substrate having an aspect ratio of greater than 5:1. As used herein, the term "aspect ratio" refers to the ratio of the average thickness t of the glass substrate to the average diameter of the plurality of vias. For example, by utilizing a method that includes a wet electroless plating step in conjunction with a wet electroplating step, the challenges associated with metallizing vias with a high aspect ratio in a thin glass substrate may be mitigated.

In the embodiment shown in FIG. 1, the glass article is in the form of a glass substrate 102 that includes a plurality of vias 104, or precision holes, defined by one or more sidewalls 105. For example, in the embodiments described herein, the vias 104 are circular in cross section and, as such, the vias 104 have a single sidewall 105. However, it should be understood that vias with other cross-sectional geometries are contemplated include, for example vias which have more than one sidewall. The glass substrate 102 may be used, for example, as an interposer to provide vertical electrical connections within a three-dimensional integrated circuit. The glass substrate 102 comprises a first face 110 and a second face 112 opposite the first face 110. The first face 110 of the glass substrate 102 is separated from the second face 112 of the glass substrate 102 by a thickness t of the glass substrate.

The composition of the glass substrate 102 is not particularly limited, and may be selected based on the desired end use of the glass substrate 102. In some embodiments, the glass substrate 102 may be a flexible glass substrate. The glass substrate 102 may be formed from glasses suitable for electronics applications including, for example, WILLOW® glass, Eagle XG™ glass, or Code 2318 glass, manufactured by Corning, Inc. However, it should be understood that other glasses are contemplated and possible. For example, other types of ion-exchangeable glasses or fused silica may be used to form the glass substrate 102. Additionally, the glass substrate 102 may be in the shape of a wafer having a 10 cm, 15 cm, 20 cm, or 30 cm diameter, for example. However, it should be understood that glass substrates 102 of other dimensions are contemplated and possible. The thickness of the glass substrate 102 may also vary depending on its end use, although in various embodiments, the average thickness t of the glass substrate is greater than or equal to 50 μm and less than or equal to 150 μm. For example, the glass substrate 102 may have a thickness of from greater than or equal to 90 μm and less than or equal to 110 μm. In various embodiments, the glass substrate 102 has a thickness of less than or equal to about 100 μm. In some embodiments, the glass substrate 102 has a thickness of less than 100 μm. However, it should be understood that glass substrates of any suitable thickness may be utilized. In embodiments, the thickness of the glass substrate may be measured through interferometric methods at locations within the area of the substrate. Additionally or alternatively, mechanical means (e.g., calipers) may be used to measure the thickness of the glass substrate. Unless otherwise specified, thickness of the glass substrate is measured by interferometric methods.

The plurality of vias 104 can be formed in the glass substrate 102 by any suitable method. For example, in embodiments, the plurality of vias 104 may be drilled in the glass substrate 102 using a pulsed laser. The laser may be any laser having suitable optical properties for drilling through the glass substrate 102 as well as a sacrificial cover layer positioned on a surface of the glass substrate 102. Suitable lasers include, without limitation, ultra-violet (UV) lasers, such as frequency tripled neodymium doped yttrium orthovanadate (Nd:YVO$_4$) lasers, which emit a beam of coherent light having a wavelength of about 355 nm. The beam of the laser may be directed onto a predetermined location on the surface of the glass substrate and pulsed to form each of the plurality of vias 104 in the glass substrate 102. Alternatively, the plurality of vias may be mechanically machined.

In some embodiments, a diameter of an opening of a via in face 110 of the glass substrate 102 and a diameter of an opening of the via in face 112 of the glass substrate 102 may be the same such that the via is cylindrical. Alternatively, a diameter of an opening of a via in face 110 of the glass substrate 102 and a diameter of an opening of the via in face 112 of the glass substrate 102 may differ by 2 μm or less, such that the via is substantially cylindrical. In other embodiments, a diameter of the vias may decrease from one face of the glass substrate 102 to the other face of the glass substrate 102 such that the vias have a cone shape. In various embodiments, each of the plurality of vias has an average diameter of greater than or equal to 8 μm and less than or equal to 20 μm, or greater than or equal to 8 μm and less than or equal to 12 μm. For example, each of the plurality of vias may have an average diameter of about 20 μm, about 15 μm, about 12 μm, or about 10 μm. As used herein, the term "average diameter" refers to the diameter of the via normal to the axis of the via through the thickness of the glass, averaged along the axis of the via. In embodiments, the average diameter is measured using an SEM cross-section or visual metrology from the top/bottom side (e.g., averaging the top, waist (or some location within the via within the thickness of the glass), and the bottom). Unless otherwise specified, the average diameter is measured using an SEM cross-section.

According to various embodiments, the aspect ratio is greater than or equal to 3:1, or greater than or equal to 5:1. For example, the aspect ratio may be greater than or equal to 3:1 and less than or equal to 16:1, greater than or equal to 5:1 and less than or equal to 12:1, or greater than or equal to 5:1 and less than or equal to 10:1.

Figure 5:
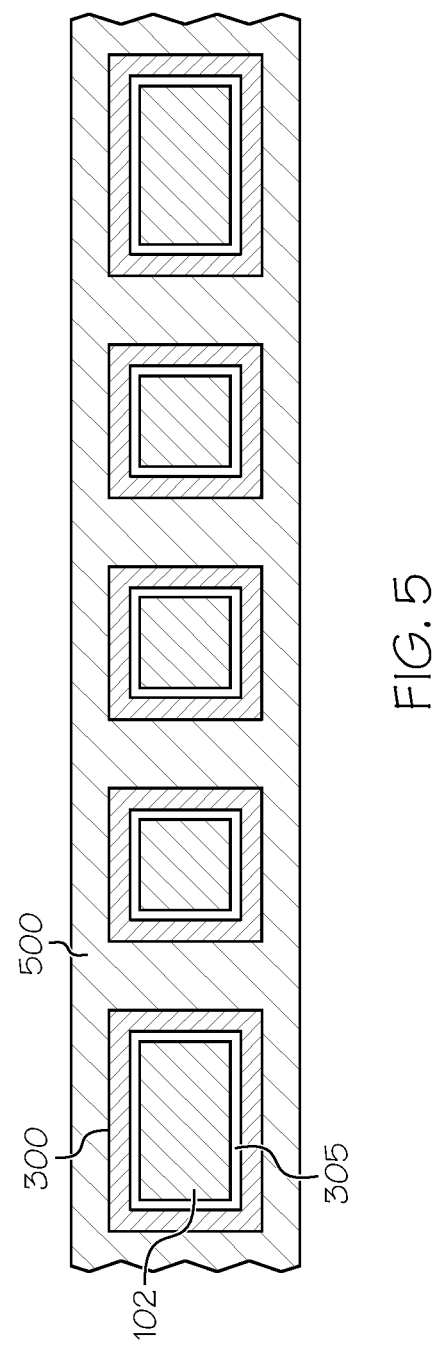
FIG. 5 schematically depicts a cross-section of a glass substrate in which the plurality of vias are filled with electrically conductive material in accordance with one or more embodiments shown and described herein.

In the embodiments described herein, the plurality of vias 104 are filled with an electrically conductive material 500 (shown in FIG. 5). The electrically conductive material may be, by way of example and not limitation, copper, silver, aluminum, nickel, alloys thereof, and combinations thereof. In some embodiments, the plurality of vias 104 are filled with a copper-containing material, such as a copper alloy. In various embodiments, the electrically conductive material in each of the plurality of filled vias has a void volume fraction of less than or equal to 5%, less than or equal to 4%, less than or equal to 3%, or even less than or equal to 1% by volume. In some embodiments, the electrically conductive material in each of the plurality of filled vias has a void volume fraction of less than or equal to 1%. In some embodiments, the electrically conductive material in each of the plurality of filled vias is free of voids (i.e., the electrically conductive material in each of the plurality of filled vias has a void volume fraction of 0%). In embodiments herein, the void volume is measured based on analysis of a scanning electron microscope (SEM) cross-section image or an X-ray CT scan. Unless otherwise specified, the void volume fraction is measured based on analysis of an SEM cross-section. Accordingly, "free of voids" means that there are no voids visible according to the resolution of the imaging equipment.

Figure 2:
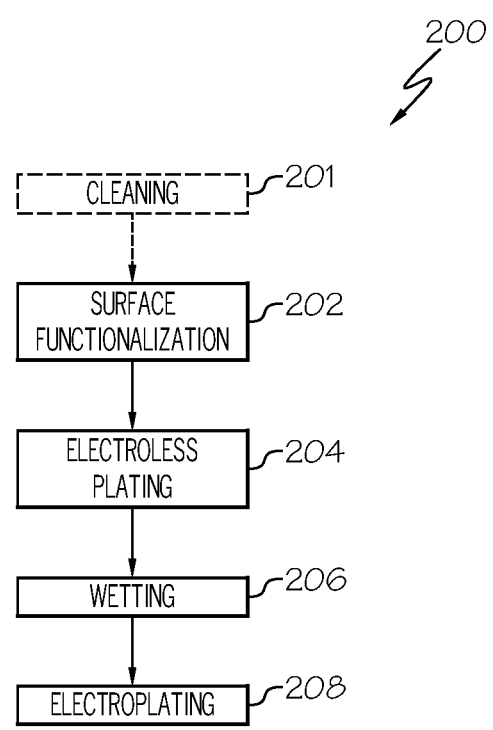
FIG. 2 schematically depicts a method for metallizing the plurality of vias in accordance with one or more embodiments shown and described herein.

FIG. 2 depicts one embodiment of a method 200 for filling, or metallizing, the vias with the electrically conductive material. In particular, as shown in FIG. 2, the method generally includes functionalizing a surface of the glass substrate (step 202), applying an electroless plating solution to deposit a seed layer on the functionalized surface (step 204), wetting the glass substrate including the seed layer (step 206) and employing an electroplating process to reduce a conductive material within the vias on the seed layer (step 208). In embodiments, the method 200 is performed as a wet process that enables the electrically conductive material to be substantially void-free manner without the use of a temporary carrier, thereby enabling the method 200 to be employed in roll-to-roll manufacturing processes. As used herein, the term "substantially void-free" means that the electrically conductive material has a void volume fraction of less than or equal to 5%, less than or equal to 1%, less than or equal to 0.5%, less than or equal to 0.1%, less than or equal to 0.05%, or even 0%.

In some embodiments, prior to functionalizing the surface of the glass substrate, the glass substrate may be optionally cleaned (optional step 201). Cleaning may be performed according to any conventional cleaning process known and used in the art to remove organic residues and enrich hydroxyl groups on the surface of the glass substrate. For example, the glass substrate may be cleaned by a process such as $O_2$ plasma, UV-ozone, or RCA cleaning to remove organics and other impurities (metals, for example) that would interfere with the silane reacting with the surface silanol groups. Washes based on other chemistries may also be used, for example, HF or $H_2SO_4$ wash chemistries. In some embodiments, the glass substrate may be cleaned with a detergent in an ultrasonic bath and rinsed with deionized water. In various embodiments, the glass substrate has a water contact angle of less than or equal to 7 degrees, less than or equal to 6 degrees, less than or equal to 5 degrees after cleaning, less than or equal to 4 degrees, or less than or equal to 2 degrees as measured using an goniometer, such as DSA100 available from Kruss GmbH (Germany).

At step 202, the surface of the glass substrate 102 is functionalized with a silane. In embodiments, the surface of the glass substrate 102 that is functionalized includes one or more of the sidewall(s) 105 of the plurality of vias 104, the first surface 110 of the glass substrate 102, and the second surface 112 of the glass substrate 102. Silanes are chosen so as to produce a suitable surface energy on the functionalized surfaces, and so as to have sufficient thermal stability upon exposure to elevated temperatures experienced by the glass substrate 102 in downstream processing. Suitable silanes may include, by way of example and not limitation, cationic silanes or polymers, such as 3-(2-amino ethylamino)propyldimethoxy-methylsilane. Moreover, in various embodiments, silane modification of the surface of the glass substrate modifies the glass surface to have a positive charge and enables binding of the palladium (Pd) used in the electroless plating to the surface of the glass substrate, as will be described in greater detail below.

In embodiments, the surface functionalization is performed by diluting a silane in isopropanol to form a silane solution and submerging the glass substrate in the silane solution. Optionally, ultrasonic energy is applied to the silane solution with the submerged glass substrate and the glass substrate to enhance wetting and bubble removal. In embodiments, the glass substrate is soaked in the silane solution for a predetermined period of time. For example, the glass substrate may be submerged in the silane solution for a period of time of greater than or equal to 15 minutes, greater than or equal to 20 minutes, or greater than or equal to 30 minutes. After soaking in the silane solution, the glass substrate may be dried, for example, in an oven. While one example of a functionalization process is described herein, it should be understood that other functionalization processes are contemplated, provided that such processes are effective to adsorb the silane to the surface of the glass substrate. In embodiments, the glass substrate may be heated to control the surface hydroxyl concentration prior to functionalization, and/or may be heated after silane application to complete silane condensation with the hydroxyl groups on the surface of the glass substrate.

After functionalization, in step 204, electroless plating is used to deposit a seed layer 300 of a conductive material (e.g., a copper seed layer) on the surface of the glass substrate, as depicted in FIG. 3. In the embodiments described herein, the deposition of the seed layer renders the surfaces of the glass substrate electrically conductive, enabling an electroplating technique to be used to fill the vias with electrically conductive material. In particular, the seed layer 300 is deposited on the silane-modified surface 305 of the glass substrate 102. In embodiments, commercially available kits and/or electroless plating solutions may be employed to deposit the seed layer 300. For example, in some embodiments, the glass substrate may be dipped into a catalyst mixture, such as a Pd/Sn colloid, and then rinsed. A coating of the catalyst mixture remains on the surfaces of the glass substrate after the rinsing. The catalyst on the surfaces of the glass substrate may then be activated, such as through removal of the Sn shell from the Pd. The activation may include, for example, dipping the glass substrate into an activation solution including fluoroboric acid and boric acid. Commercially available activation solutions include those available from Uyremura. After the catalyst is activated, the glass substrate may be dipped into an electroless plating bath to form the seed layer on the surface of the glass substrate. In embodiments, the seed layer 300 is formed on at least the sidewalls 105 of each of the plurality of vias 104, although it is contemplated that the seed layer 300 may be additionally be formed on the first surface 110, the second surface 112 of the glass substrate 102, as shown in FIG. 3.

In embodiments, the glass substrate may be thermally annealed (not shown in FIG. 2) after the seed layer is deposited thereon to relieve stresses in the glass substrate and thereby reduce the impact of any downstream thermal processing steps which may otherwise effect the dimensional stability of the glass substrate materials, such as electrically conductive materials, deposited on the glass substrate. In embodiments, the glass substrate may be heated to a temperature of greater than or equal to 400° C. for a time period sufficient to relieve the stresses in the glass substrate.

Returning to FIG. 2, the glass substrate is wetted (step 206) following deposition of the seed layer. In embodiments, the glass substrate is wetted by submerging the glass substrate including the seed layer in water to ensure that each of the vias is wetted. For example, the glass substrate may be dipped into deionized water for a period of greater than or equal to 2 minutes. In embodiments, ultrasonic energy may be applied to the glass substrate while the glass substrate is submerged in the water to enhance wetting and bubble removal. Without being bound by theory, it is believed that wetting the glass substrate prior to electroplating ensures that the vias are pre-wetted thereby preventing bubbles from being trapped within the vias, which bubbles may create voids in the conductive material subsequently filled within the vias.

After the glass substrate is wetted at step 206, electroplating (step 208) is carried out. In particular, an electrolyte is disposed within the plurality of vias. For example, the glass substrate may be submerged in an electrolyte solution such that the electrolyte enters the vias. The electrolyte includes ions of the electrically conductive material, for example, copper ions, to be deposited on the seed layer.

In embodiments, the electrolyte comprises ions of the electrically conductive material (e.g., copper ions) in addition to chloride ions and an additive. The chloride ions combine with the organic species in the solution to form a complex that slows down the plating rate. The chloride ions may be present in a concentration of greater than or equal to 20 ppm and less than or equal to 140 ppm in the electrolyte or greater than or equal to 20 ppm and less than or equal to 120 ppm. For example, the chloride ions may be present in a concentration of 20 ppm, 80 ppm, 100 ppm, 120 ppm, or even 140 ppm.

In embodiments, the additive is a leveler, such as nitrotetrazolium blue chloride (NTB). The leveler may enhance current density in the center of the via and help control surface morphology of the deposited electrically conductive material. In addition, the leveler may possess several physiochemical characteristics, such as a potential-dependent electrochemical desorption or breakdown and a mass-transfer controlled electrochemical adsorption. The mass-transfer controlled electrochemical adsorption may create a concentration gradient of the leveler from the opening to the center of the via during plating. Without being bound by theory, it is believed that the physiochemical characteristics of the leveler, and in particular, the NTB, enable the leveler to adsorb to the via sidewalls and suppress deposition of the electrically conductive material near the opening of the vias at a greater rate than near the center of the vias.

The additive may be present in a concentration of greater than or equal to 20 ppm and less than or equal to 60 ppm in the electrolyte. For example, the additive may be present in a concentration of 20 ppm, 40 ppm, or even 60 ppm. The electrolyte may have a ratio of chloride ions to additive of greater than or equal to 0.5 and less than or equal to 7. In some embodiments, the electrolyte is free of accelerators which form electroactive species responsible for enhanced plating rate, suppressors which combine with chloride ions to inhibit plating on areas where a reduced plating rate is desired, and additional levelers that are conventionally found in electrolyte solutions for electroplating. Such single-additive electrolytes may reduce the number of degrees of freedom and simplify optimization of the electroplating process. In other words, the use of single-additive electrolytes may result in fewer variables within the electroplating process to be modified for optimization, thereby simplifying the optimization of the electroplating process.

In some particular embodiments, the electrolyte is an electrolyte bath consisting of $CuSO_4$, $H_2SO_4$, chloride ions, and NTB. In such embodiments, the $CuSO_4$ provides a source of copper ions, while the $H_2SO_4$ makes the bath conductive and acts as a charge carrier.

Electroplating is carried out by positioning one or more electrodes within the electrolyte. In various embodiments, two electrodes, three electrodes, or more can be positioned within the electrolyte. For example, in some embodiments, three electrodes are employed. In these embodiments, the glass substrate including the seed layer is the working electrode, or cathode, and the other two electrodes are anodes. In such embodiments, the anodes may be positioned on opposite sides of the glass substrate such that plating of the electrically conductive material may be conducted symmetrically from both sides of the glass substrate. The anodes may be, by way of example and not limitation, copper plates. While a specific configuration of the electrodes is described herein, it should be understood that other configurations are contemplated and possible.

Thereafter, a current is supplied through the electrodes, the electrolyte, and the glass substrate, thereby reducing the electrically conductive ions in the electrolyte into electrically conductive material within the plurality of vias. For example, in embodiments in which the electrolyte includes copper ions, the copper ions are reduced into copper within the plurality of vias such that each of the plurality of vias is filled with copper. In embodiments, the current is applied at a current density of greater than or equal to 0.05 amps/$dm^2$ and less than or equal to 2 amps/$dm^2$. The current density is a measure of the total current passed over a time period divided by the total surface area over which the deposition took place. In various embodiments, the total surface area is a summation of the first and second surfaces of the glass substrate and the interior surface areas of the vias. The current density, in various embodiments, is constant. However, the current density may be varied during the electroplating process. For example, in embodiments, the current may be changed in a step-wise fashion during the electroplating process.

In embodiments, the current is applied at a first current density for a first period of time and then at a second current density for a second period of time. In embodiments, the second current density is greater than the first current density. For example, the current may be applied at a current density of about 0.05 amps/$dm^2$ (ampere per square decimeter or "ASD") for a time sufficient to generate a "butterfly" merged shape within the vias, as shown in FIG. 4. In particular, as shown in FIG. 4, when vias are being filled with copper, the copper tends to begin to deposit on the walls at the center of the via where it plugs at the center forming a "butterfly" or two vias. The two vias fill to complete the deposition of the through-glass vias. Without being bound by theory, the initial use of a low current density results in greater copper particle diffusion distance, enabling the copper particles to deposit and build up along the center of the via sidewall as opposed to along the entrance to the via, which can seal up the via and result in voids within the copper material, particularly when coupled with the effects of the leveler in the electrolyte, which suppresses copper deposition near the entrance to the via, as described above.

After formation of the plug, or butterfly 400, the current may be applied at a second density for a second period of time to continue filling the conductive material toward the open ends of the vias. In particular, the current density may be increased following the formation of the butterfly 400 to fill the vias to improve throughput efficiency, since the diffusion limitation has decreased significantly. For example, the current may be applied at a current density of about 0.1 amps/$dm^2$ to about 1.6 amps/$dm^2$ for a time sufficient to fill the vias with the conductive material 500, as shown in FIG. 5. In some particular embodiments, the current may be applied at a current density of 0.1 amps/$dm^2$ for a period of about 5 minutes, and then at a current density of 1.6 amps/$dm^2$ until the vias are filled. It is contemplated that the current may be applied at any number of current densities to fill the vias.

In embodiments, the electroplated glass substrate may be thermally annealed (not shown in FIG. 2) after the electrically conductive material is deposited thereon to relieve the stress in the glass substrate and reduce the impact of any downstream thermal processing steps. For example, the glass substrate may be heated to a temperature of greater than or equal to 400° C. for a time period sufficient to release the stresses. In various embodiments, after being filled with the electrically conductive material, the electrically conductive material in each of the plurality of vias has a void volume fraction of less than or equal to 5% or less than or equal to 1%. In particular embodiments, the electrically conductive material in each of the plurality of vias is free of voids after being filled with the electrically conductive material.

EXAMPLES

The following examples illustrate one or more features of the embodiments described herein.

Glass substrates (WILLOW™ glass available from Corning, Incorporated) having an average thickness t of 100 µm and including 20 µm or 10 µm diameter vias were cleaned using a standard cleaning process. In particular, the substrates were cleaned with 2.5 vol % of PK-LCG225X-1 detergent at 70° C. for 8 minutes in an ultrasonic bath. The substrates were then rinsed with deionized water to remove organic residues and enrich hydroxyl groups on the substrate surfaces. After cleaning, the glass substrates showed good wettability with a water contact angle of less than 5° as measured using a DSA100 from Kruss GmbH (Germany).

Next, 1 vol % of 3-(2-aminoethylamino)propyldimethoxy-methylsilane (AEA-PDMMS) diluted in isopropanol was used to functionalize the glass surfaces. In particular, the cleaned glass substrates were submerged into the AEA-PDMMS solution with applied ultra sonic energy at 23° C. for 30 minutes. The glass substrates were then dried in an oven at 120° C. for 1 hour.

The AEA-PDMMS-modified glass substrates were then processed using a copper electroless plating kit available from Uyemura, Taiwan. Specifically, the glass substrates were dipped into a Pd/Sn colloid at room temperature for 8 minutes, then gently rinsed with deionized water. Next, the glass substrates were dipped into an activation solution at room temperature for 3 minutes to remove the Sn shell from the Pd catalyst. Finally, the glass substrates were dipped into an electroless plating bath at 35° C. for 5 minutes to form a uniform copper layer having a thickness of greater than or equal to 130 nm and less than or equal to 200 nm on the surface of the glass substrates and on the via sidewalls. The glass substrates including the seed layer were annealed by rapid thermal process (RTA) at 400° C. for 8 minutes with a 10° C./s ramping rate to release the stress.

Figure 6A:
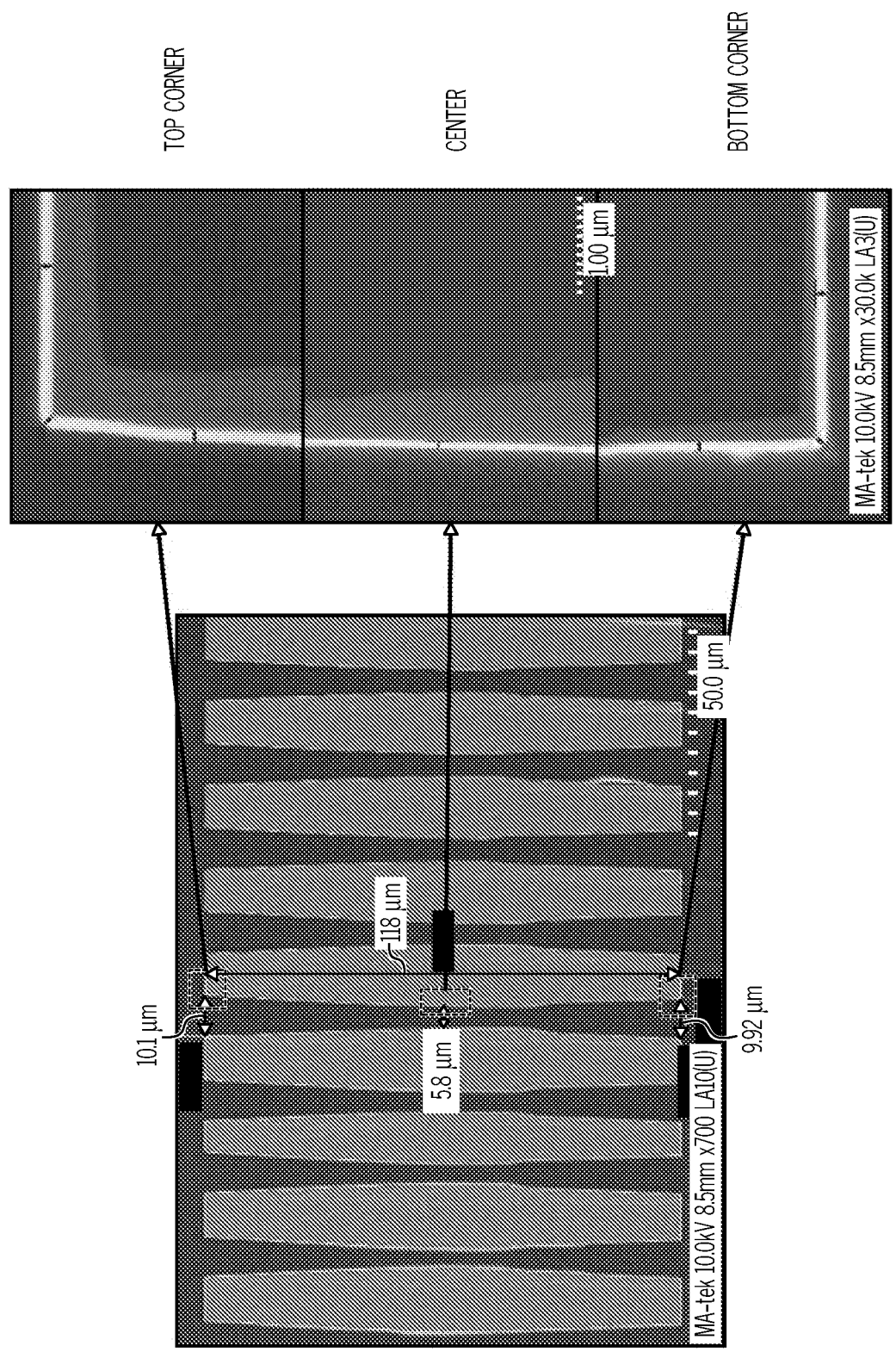
FIG. 6A is a scanning electron microscope (SEM) image showing the uniform and continuous copper seed layer deposited on the sidewall of a 10 μm diameter via in the glass substrate having an aspect ratio of 10 in accordance with one or more embodiments shown and described herein.
Figure 6B:
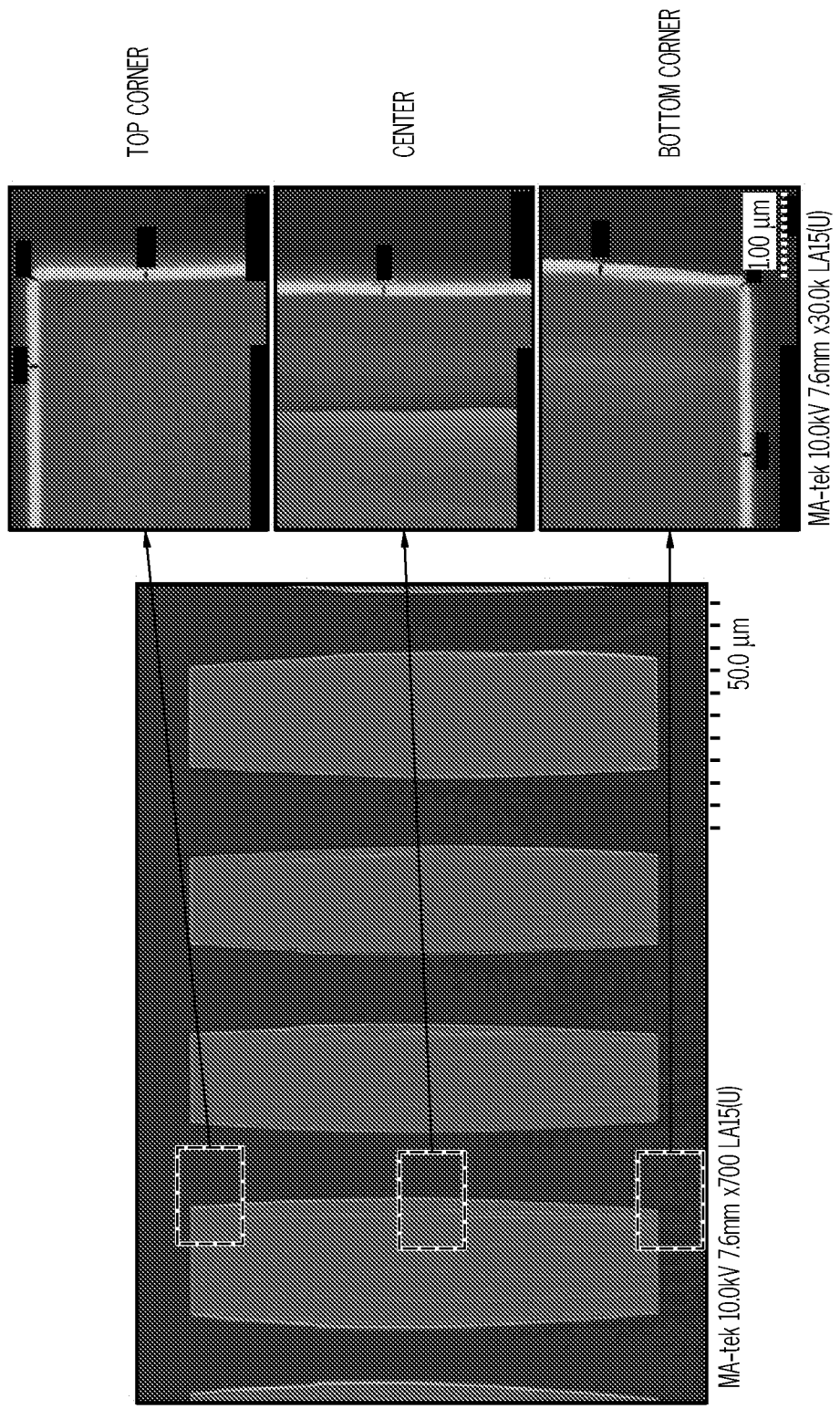
FIG. 6B is a scanning electron microscope (SEM) image showing the uniform and continuous copper seed layer deposited on the sidewall of a 20 μm diameter via in the glass substrate having an aspect ratio of 5 in accordance with one or more embodiments shown and described herein.

FIG. 6 is a scanning electron microscope (SEM) image showing the uniform and continuous copper seed layer deposited on the sidewall of a via in the glass substrate having an aspect ratio of 10 (e.g., via diameter of 10 μm).

The glass substrates were then pre-wetted by dipping the glass substrate into DI water in an ultrasonic bath for 2 minutes. Next, the wetted glass substrates were plated in a 2 L electrolyte bath including 0.88 M $CuSO_4.5H_2O$ and 0.54 M $H_2SO_4$. The electrolyte bath included 20 ppm of chloride ions and 40 ppm of nitrotetrazolium blue chloride. The glass substrates were positioned between two copper plates (anodes), and a constant current density of 0.05 amps/$dm^2$ was applied using an Auto-Lab PGSTAT 302N to plug the vias, forming the butterfly shape within the vias, as shown in FIGS. 7A and 7B.

Figure 7C:
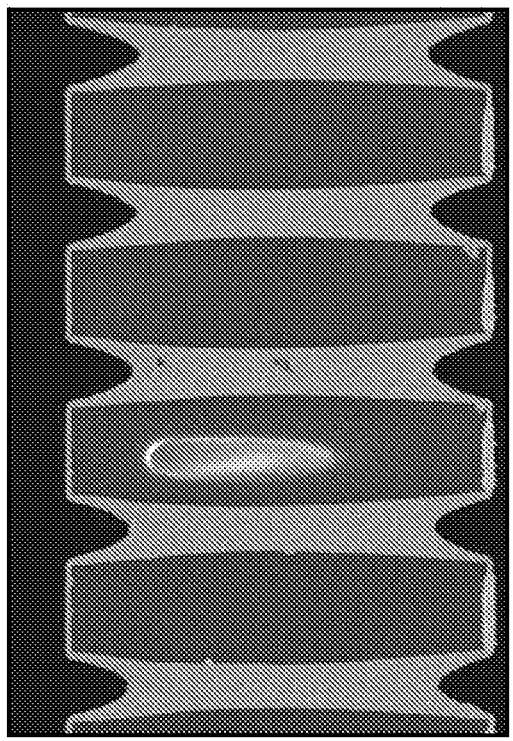
FIG. 7C is an SEM image showing the formation of a plug formed from the copper within the 20 μm vias in accordance with one or more embodiments shown and described herein.
Figure 7D:
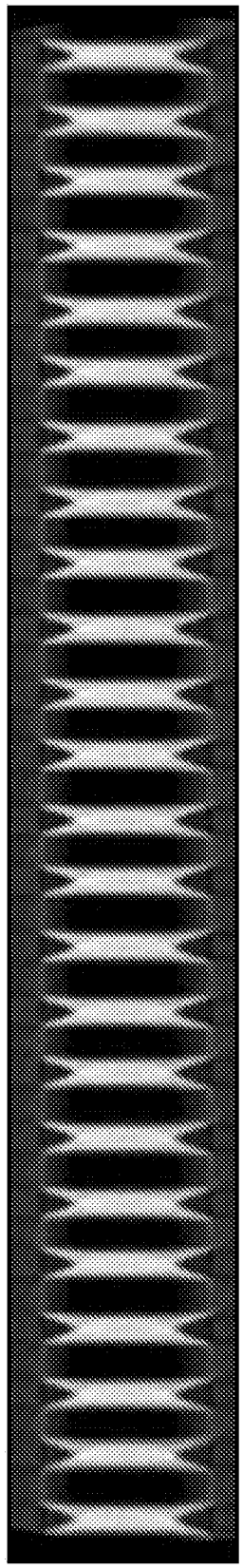
FIG. 7D is a CT scan image further evidencing the formation of the plug formed from the copper within the 20 μm vias in accordance with one or more embodiments shown and described herein.
Figure 8B:
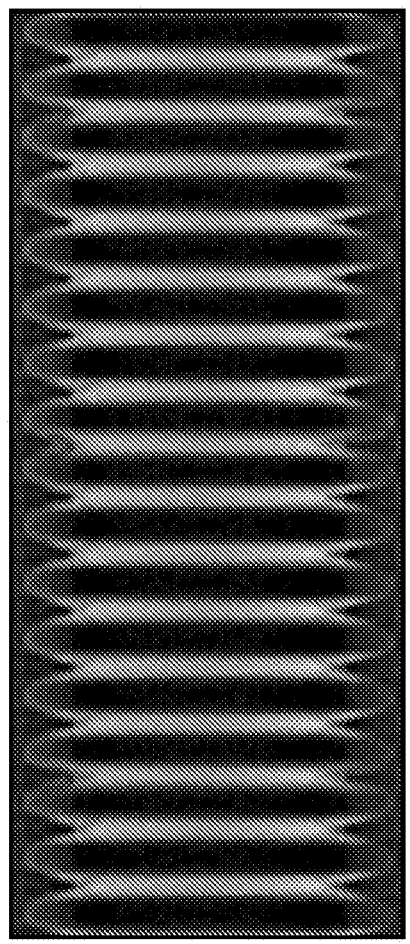
FIG. 8B is a CT scan image further evidencing the complete and void-free filling of the 10 μm vias in accordance with one or more embodiments shown and described herein.
Figure 8A:
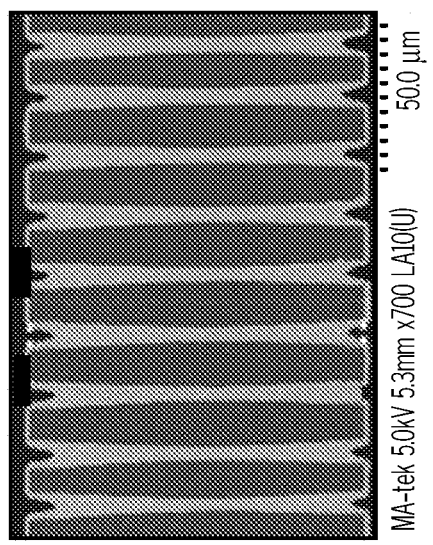
FIG. 8A is an SEM image showing the complete and void-free filling of the 10 μm vias with the copper in accordance with one or more embodiments shown and described herein.
Figure 8C:
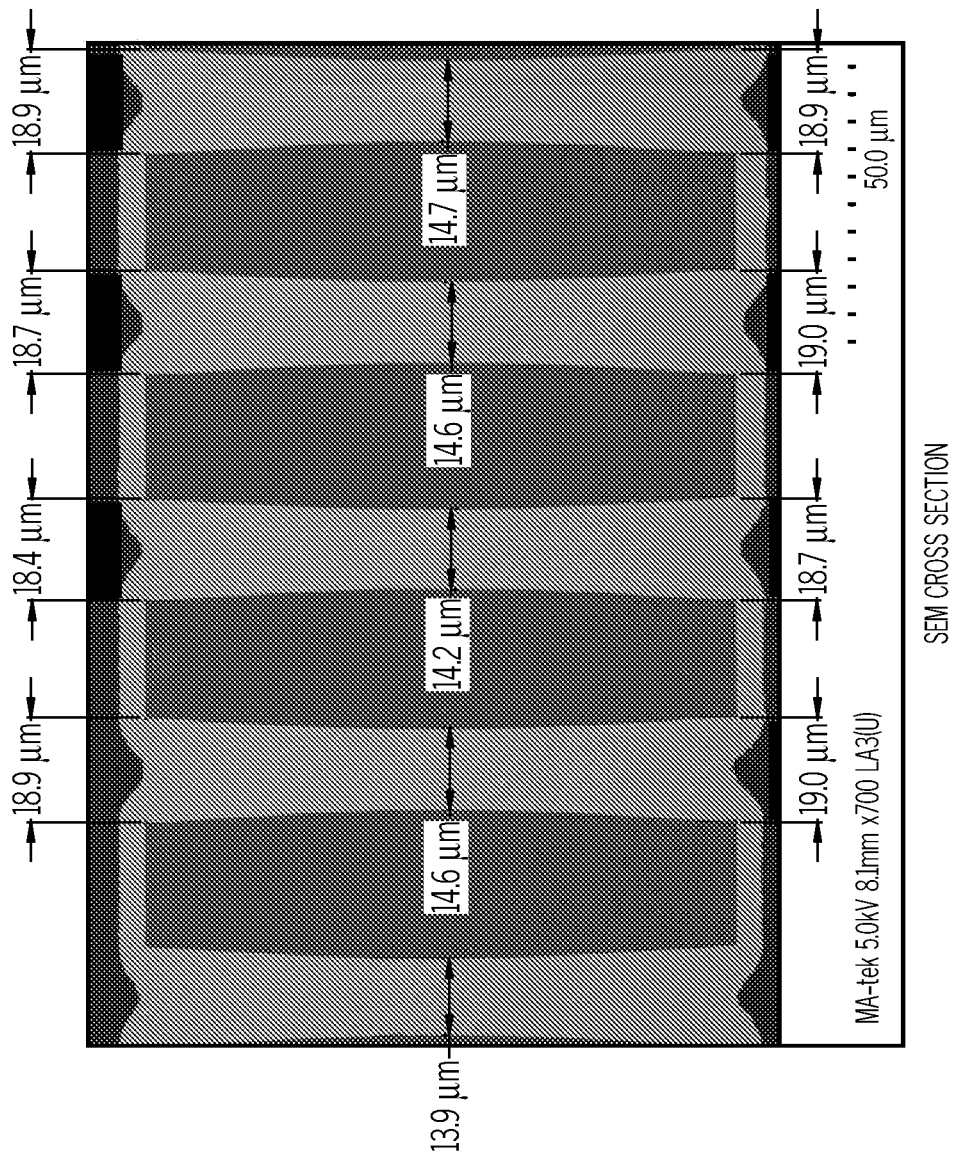
FIG. 8C is an SEM image showing the complete and void-free filling of the 20 μm vias with the copper in accordance with one or more embodiments shown and described herein.

FIG. 7A is an SEM image showing the plug in the shape of a butterfly within the 10 μm vias. FIG. 7B is a CT scan image further evidencing the formation of the plug within the 10 μm vias. FIG. 7C is an SEM image showing the plug in the shape of a butterfly within the 20 μm vias. FIG. 7D is a CT scan image further evidencing the formation of the plug within the 20 μm vias Following formation of the plug within the through-glass vias, the current density was increased to 0.1 amps/$dm^2$ for 5 minutes, and then increased to 1.6 amps/$dm^2$ to completely fill the vias with the copper. FIG. 8A is an SEM image showing the complete and void-free filling of the 10 μm vias with the copper. FIG. 8B is a CT scan image further evidencing the complete and void-free filling of the 10 μm vias. FIG. 8C is an SEM image showing the complete and void-free filling of the 20 μm vias with the copper.

Figure 9A:
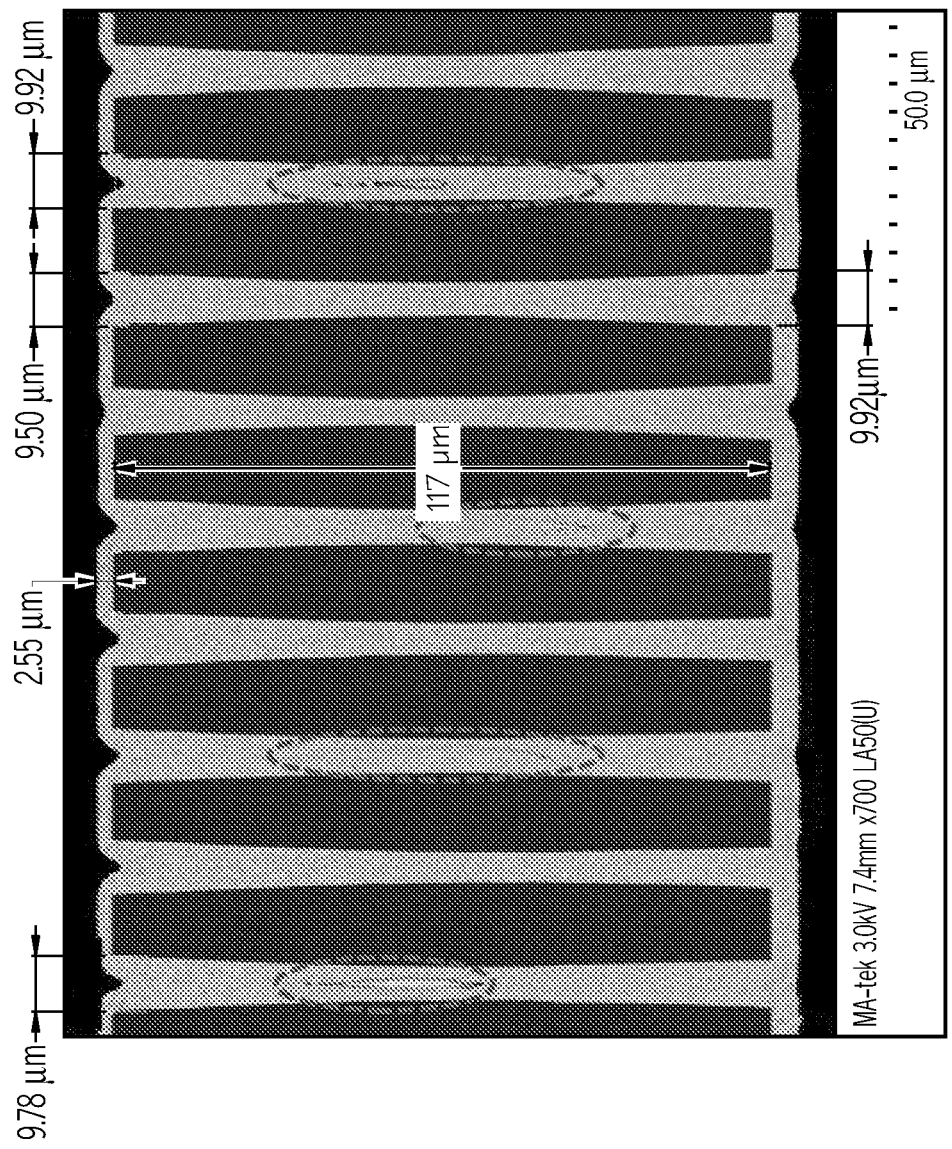
FIG. 9A is an SEM image showing voids created within the vias as a result of the electroplating at a current density of 0.16 amps/dm$^2$ through the entirety of the process.
Figure 9C:
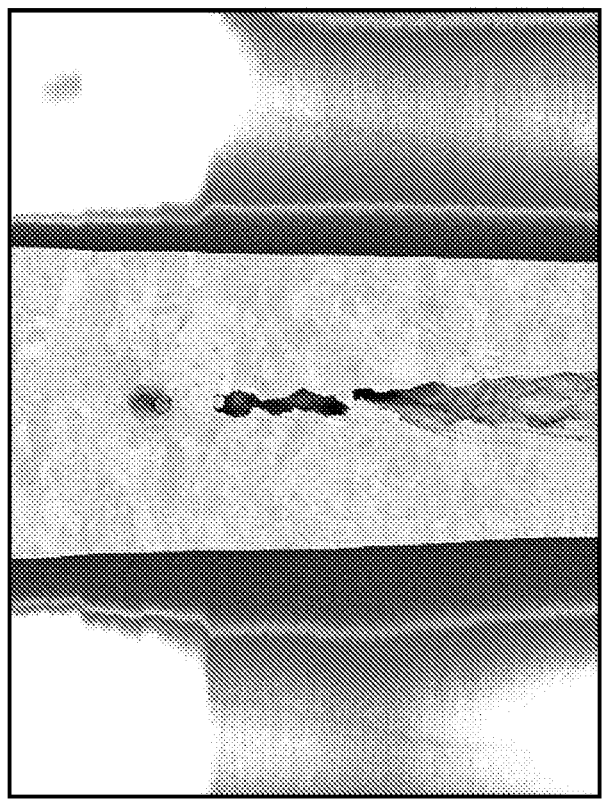
FIGS. 9B and 9C are SEM images further evidencing the voids within the vias as a result of the electroplating at a current density of 0.16 amps/dm$^2$ through the entirety of the process.
Figure 9B:
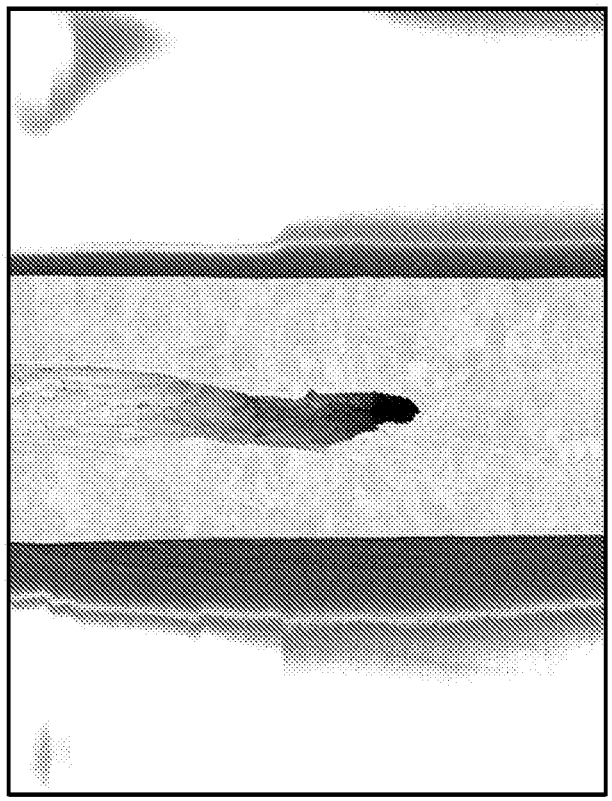

As a comparative example, a glass substrate (WILLOW™ glass available from Corning, Incorporated) having an average thickness t of 100 μm and including 10 μm diameter vias was cleaned, processed using the copper electroless plating kit, and pre-wetted as described for the samples above. However, following pre-wetting, the wetted glass substrate was plated at a constant current density of 0.16 amps/$dm^2$ was applied using an Auto-Lab PGSTAT 302N. The electrolyte solution was the same as described for the samples above. FIG. 9A-9C show the results. In particular, FIG. 9A is an SEM image showing voids created within the vias as a result of the electroplating at the current density of 0.16 amps/$dm^2$ through the entirety of the process. FIGS. 9B and 9C are additional SEM images further evidencing the voids within the vias.

Accordingly, FIGS. 6-8B demonstrate that the methods described herein may be used to produce a thin (<150 μm thick) glass substrate including vias at an aspect ratio of greater than 5:1 that are filled with copper such that the electrically conductive material in the filled vias have a void volume fraction of less than 5%. Specifically, the examples show that the methods may be used to produce a 100 μm thick glass substrate including vias at an aspect ratio of 12:1 that are filled with copper such that the electrically conductive material in the vias is free of voids.

It should now be understood that embodiments of the present disclosure enable through-glass vias to be formed in a thin glass substrate at an aspect ratio of greater than or equal to 5:1 and metallized such that the electrically conductive material in the filled vias has a void volume fraction of less than or equal to 5%. In particular, various embodiments enable a glass substrate including through-glass vias to be metallized without the use of a carrier. Accordingly, such processes may be used in roll-to-roll processes to fill through holes in thin, flexible glass substrates without the creation of voids.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A method for metallizing through-glass vias in a glass substrate, the method comprising:
  functionalizing a surface of the glass substrate with a silane, wherein the glass substrate has an average thickness t and comprises a plurality of vias extending through the thickness t;
  applying an electroless plating solution comprising a copper ion to deposit a copper seed layer on the functionalized surface;
  disposing an electrolyte within the plurality of vias, wherein the electrolyte comprises copper ions to be deposited on the copper seed layer within the plurality of vias;
  positioning an electrode within the electrolyte; and
  applying a current between the electrode and the glass substrate, thereby reducing the copper ions into copper within the plurality of vias such that each of the plurality of vias is filled with copper and the copper has a void volume fraction of less than 5%, wherein the second current density is greater than or equal to 0.75 amps/$dm^2$ and less than or equal to 2 amps/$dm^2$.

2. The method according to claim 1, wherein the average thickness t of the glass substrate is greater than or equal to 50 μm and less than or equal to 150 μm.

3. The method according to claim 1, wherein the average thickness t of the glass substrate is greater than or equal to 90 μm and less than or equal to 110 μm.

4. The method according to claim 1, wherein each of the plurality of vias has an average diameter of greater than or equal to 8 μm and less than or equal to 20 μm; and an aspect ratio of the average thickness t of the glass substrate to the average diameter of the plurality of vias is greater than or equal to 5:1 and less than or equal to 12:1.

5. The method according to claim 1, wherein the electrolyte further comprises chloride ions and an additive.

6. The method according to claim 5, wherein the additive consists of nitrotetrazolium blue chloride.

7. The method according to claim 6, wherein the additive is present in the electrolyte in a concentration of greater than or equal to 20 ppm and less than or equal to 60 ppm.

8. The method according to claim 5, wherein the chloride ions are present in the electrolyte in a concentration of greater than or equal to 20 ppm and less than or equal to 140 ppm.

9. The method according to claim 1, wherein applying the current comprises applying the current at a current density of greater than or equal to 0.05 amps/dm$^2$ and less than or equal to 2 amps/dm$^2$.

10. The method according to claim 1, further comprising wetting the glass substrate including the copper seed layer prior to disposing the electrolyte within the plurality of vias.

11. The method according to claim 1, wherein the copper in each of the plurality of vias has a void volume fraction of less than 1%.

12. The method according to claim 1, wherein the copper in each of the plurality of vias is free of voids.

13. The method according to claim 1, further comprising cleaning the glass substrate prior to functionalizing the surface, wherein the glass substrate has a water contact angle of less than or equal to 5 degrees after the cleaning.

14. The method according to claim 1, wherein functionalizing the surface of the glass substrate comprises functionalizing sidewalls of the plurality of vias.

15. The method according to claim 1, further comprising annealing the glass substrate comprising the copper seed layer prior to disposing the electrolyte within the plurality of vias.

* * * * *